(12) United States Patent
Shin et al.

(10) Patent No.: US 11,804,270 B2
(45) Date of Patent: Oct. 31, 2023

(54) NON-VOLATILE MEMORY DEVICE

(71) Applicant: SAMSUNG ELECTRONICS CO., LTD., Suwon-si (KR)

(72) Inventors: Ji-Yeon Shin, Anyang-si (KR); Jeong-Don Ihm, Seongnam-si (KR); Byung-Hoon Jeong, Hwaseong-si (KR); Jung-June Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/460,954

(22) Filed: Aug. 30, 2021

(65) Prior Publication Data

US 2021/0391023 A1 Dec. 16, 2021

Related U.S. Application Data

(63) Continuation of application No. 17/010,100, filed on Sep. 2, 2020, now Pat. No. 11,114,171, which is a
(Continued)

(30) Foreign Application Priority Data

Nov. 8, 2017 (KR) .......................... 10-2017-0148320

(51) Int. Cl.
*G11C 16/30* (2006.01)
*G11C 7/10* (2006.01)
(Continued)

(52) U.S. Cl.
CPC ............ *G11C 16/30* (2013.01); *G11C 7/1051* (2013.01); *G11C 16/26* (2013.01); *H10B 41/27* (2023.02);
(Continued)

(58) Field of Classification Search
CPC ..................................................... G11C 16/32
See application file for complete search history.

(56) References Cited

U.S. PATENT DOCUMENTS 4,282,496 A 8/1981 Heuner
5,270,588 A 12/1993 Choi
(Continued)

FOREIGN PATENT DOCUMENTS

KR 1999-004870 A 1/1999
KR 10-2019-0067940 6/2019

*Primary Examiner* — Douglas King
(74) *Attorney, Agent, or Firm* — Lee IP Law, P.C.

(57) ABSTRACT

A non-volatile memory device includes a memory cell region including a first metal pad and a memory cell array including a plurality of memory cells, and a peripheral circuit region including a second metal pad and an output driver to output a data signal, and vertically connected to the memory cell region by the first metal pad and the second metal pad. The output driver includes a pull-up driver and a pull-down driver. The pull-up driver includes a first pull-up driver having a plurality of P-type transistors and a second pull-up driver having a plurality of N-type transistors. The pull-down driver includes a plurality of N-type transistors. One or more power supply voltages having different voltage levels are selectively applied to the pull-up driver. A first power supply voltage is applied to the first pull-up driver, and a second power supply voltage is applied to the second pull-up driver.

24 Claims, 26 Drawing Sheets

Related U.S. Application Data continuation-in-part of application No. 16/048,786, filed on Jul. 30, 2018, now Pat. No. 10,770,149.

(51) Int. Cl.
  *G11C 16/26* (2006.01)
  *H10B 41/27* (2023.01)
  *H10B 41/35* (2023.01)
  *H10B 41/40* (2023.01)
  *H10B 43/27* (2023.01)
  *H10B 43/35* (2023.01)
  *H10B 43/40* (2023.01)

(52) U.S. Cl.
  CPC .............. *H10B 41/35* (2023.02); *H10B 41/40* (2023.02); *H10B 43/27* (2023.02); *H10B 43/35* (2023.02); *H10B 43/40* (2023.02)

(56) References Cited

U.S. PATENT DOCUMENTS

| | | |
|---|---|---|
| 5,740,106 A | 4/1998 | Nazarian |
| 5,773,999 A | 6/1998 | Park et al. |
| 5,793,226 A | 8/1998 | Park et al. |
| 5,811,997 A * | 9/1998 | Chengson ...... H03K 19/018585 327/108 |
| 5,933,041 A | 8/1999 | Sessions et al. |
| 6,069,504 A | 5/2000 | Keeth |
| 6,141,263 A | 10/2000 | Protzman |
| 6,236,239 B1 | 5/2001 | Kogushi |
| 6,281,729 B1 | 8/2001 | Ang et al. |
| 6,330,196 B1 | 12/2001 | Protzman |
| 6,512,401 B2 | 1/2003 | Clark et al. |
| 6,894,529 B1 | 5/2005 | Chong et al. |
| 7,208,973 B2 | 4/2007 | Kwon |
| 7,282,955 B2 | 10/2007 | Kim |
| 7,463,073 B2 | 12/2008 | Chung et al. |
| 7,471,121 B2 | 12/2008 | Yang et al. |
| 9,911,469 B1 | 3/2018 | Hollis et al. |
| 2002/0186596 A1 | 12/2002 | Matsumoto et al. |
| 2003/0112041 A1 | 6/2003 | Clark et al. |
| 2005/0057281 A1 | 3/2005 | Yoo |
| 2009/0058474 A1 | 3/2009 | Kim |
| 2009/0267641 A1 * | 10/2009 | Chen .................. H03K 19/0005 326/30 |
| 2009/0296497 A1 | 12/2009 | Hirabayashi |
| 2011/0242916 A1 | 10/2011 | Seol et al. |
| 2012/0243345 A1 | 9/2012 | Matsuoka |
| 2013/0155790 A1 | 6/2013 | Atsumi |
| 2016/0078909 A1 | 3/2016 | Arai et al. |
| 2017/0212695 A1 | 7/2017 | Hollis et al. |

\* cited by examiner

NON-VOLATILE MEMORY DEVICE

CROSS-REFERENCE TO RELATED APPLICATIONS

This application is a continuation of pending U.S. application Ser. No. 17/010,100, filed on Sep. 2, 2020, which in turn is a continuation-in-part of U.S. application Ser. No. 16/048,786, filed on Jul. 30, 2018, now U.S. Pat. No. 10,770,149 B2, issued Sep. 8, 2020, which claims the benefit of Korean Patent Application No. 10-2017-0148320, filed on Nov. 8, 2017, in the Korean Intellectual Property Office, the disclosures of all being incorporated herein in their entirety by reference.

BACKGROUND

1. Field

One or more embodiments herein relate to a non-volatile memory device.

2. Description of the Related Art

A variety of memory devices have been developed to store data. Examples include volatile memory devices and non-volatile memory devices. One type of non-volatile memory device is a flash memory device, which is often used in mobile phones, digital cameras, portable digital assistant (PDAs), mobile computer devices, stationary computer devices, and other products. A non-volatile memory device typically includes a data output driver having a pull-up driver and a pull-up driver, each of which includes a plurality of transistors.

SUMMARY

In accordance with one or more embodiments, a non-volatile memory device includes a memory cell region including a first metal pad and a memory cell array including a plurality of memory cells; and a peripheral circuit region including a second metal pad and an output driver to output a data signal, and vertically connected to the memory cell region by the first metal pad and the second metal pad, wherein the output driver includes a first pull-up driver having a plurality of P-type transistors and a second pull-up driver having a plurality of N-type transistors; and a pull-down driver including a plurality of N-type transistors, wherein one or more power supply voltages having different voltage levels are selectively applied to the pull-up driver and a first power supply voltage is applied to the first pull-up driver and a second power supply voltage is applied to the second pull-up driver.

In accordance with one or more other embodiments, a non-volatile memory device includes a memory cell region including a first metal pad and a memory cell array including a plurality of memory cells; and a peripheral circuit region including a second metal pad, an output driver to output a data signal, and an operating signal generator to generate a plurality of operating signals for operating the output driver, and vertically connected to the memory cell region by the first metal pad and the second metal pad, wherein the output driver includes: a pull-up driver including a first pull-up driver having a plurality of P-type transistors and a second pull-up driver having a plurality of N-type transistors; and a pull-down driver having a plurality of N-type transistors, wherein one or more power supply voltages having different voltage levels are to be selectively applied to the pull-up driver.

In accordance with one or more other embodiments, a non-volatile memory device includes a memory cell region including a first metal pad and a memory cell array including a plurality of memory cells; and a peripheral circuit region including a second metal pad, an output driver to output a data signal, and an operating signal generator to generate a plurality of operating signals for operating the output driver, and vertically connected to the memory cell region by the first metal pad and the second metal pad, wherein the output driver includes: a pull-up driver including a first pull-up driver having a plurality of P-type transistors and a second pull-up driver having a plurality of N-type transistors; and a pull-down driver including a first pull-down driver having a plurality of P-type transistors and a second pull-down driver having a plurality of N-type transistors.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
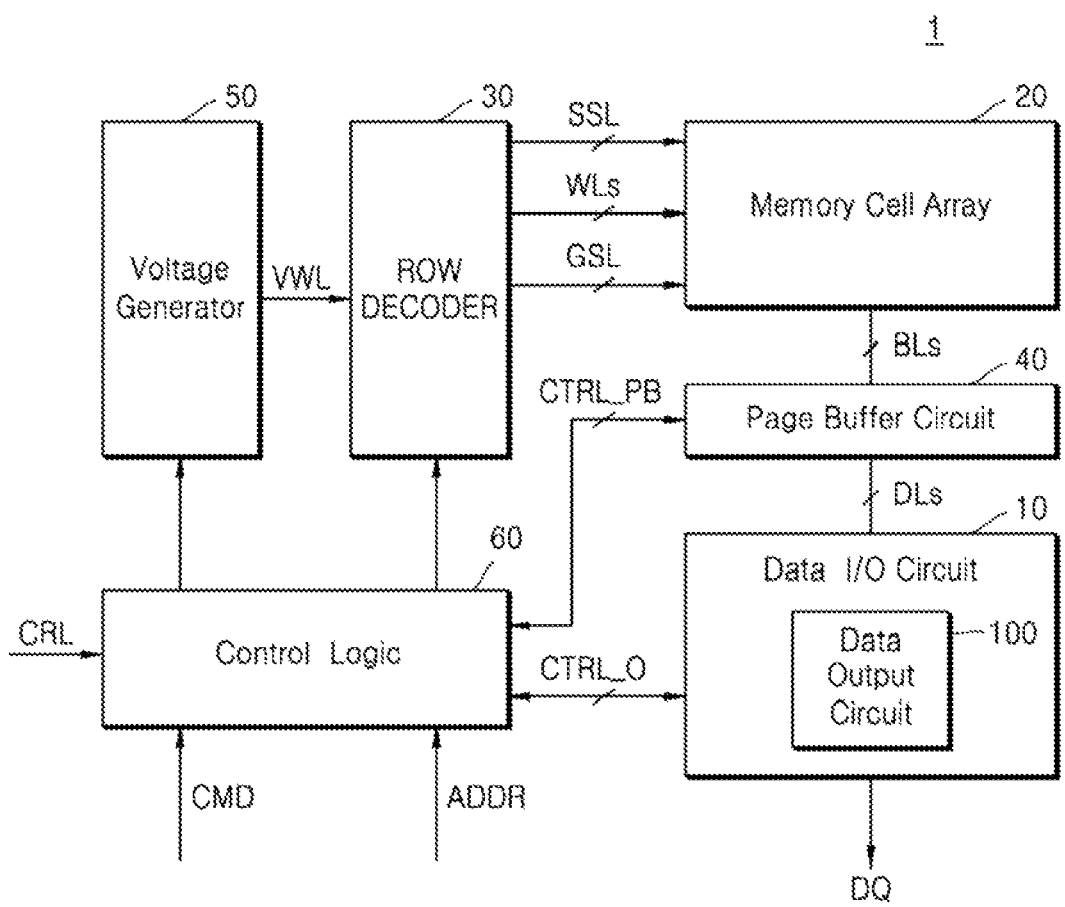
FIG. 1 illustrates an embodiment of a non-volatile memory device.

FIG. 1 illustrates an embodiment of a non-volatile memory device 1 which may include a memory cell array 20, a row decoder 30, a page buffer circuit 40, a voltage generator 50, a data input/output circuit 10, and control logic 60. The non-volatile memory device 1 may include other or different features in another embodiment.

The non-volatile memory device 1 may include a NAND flash memory, a vertical NAND (VNAND) flash memory, a NOR flash memory, a resistive random-access memory (RRAM), a phase-change random-access memory (PRAM), a magnetoresistive random-access memory (MRAM), a ferroelectric random-access memory (FRAM), a spin-transfer torque random-access memory (STT-RAM), or another type of memory. The non-volatile memory device 1 may have a three-dimensional array structure. For convenience of explanation, the non-volatile memory device 1 will be described as a NAND flash memory device.

The memory cell array 20 may include a plurality of memory blocks. Each memory block may include a plurality of memory cells. Some of the plurality of memory cells may be, for example, single level cells (SLCs), each storing 1-bit data. Other memory cells may be multi-level cells (MLCs).

The memory cell array 20 may be connected to the row decoder 30 through word lines WLs, string select lines SSLs, and ground select lines GSLs, and may be connected to the page buffer circuit 40 through bit lines BLs. The memory cell array 20 may include strings connected to the bit lines BLs. Each of the strings may include at least one string select transistor, a plurality of memory cells, and at least one ground select transistor connected in series between a bit line and a common source line CSL. Each of the strings may further include at least one dummy cell between the string select transistor and the plurality of memory cells, and may further include at least one dummy cell between the ground select transistor and the plurality of memory cells.

FIG. 1 shows that the non-volatile memory device 1 includes one memory cell array 20. In one embodiment, the non-volatile memory device 1 may include a plurality of memory cell arrays 20.

The row decoder 30 may select some of the word lines WLs based on a row address X-ADDR. The row decoder 30 may provide a word line voltage to a word line. During a program operation, the row decoder 30 may apply a program voltage and a verify voltage to a selected word line, and may apply a program inhibit voltage to an unselected word line. During a read operation, the row decoder 30 may apply a read voltage to a selected word line and apply a read inhibit voltage to an unselected word line. Furthermore, the row decoder 30 may select some of the string select lines SSL or some of the ground select lines GSL based on the row address X-ADDR.

The page buffer circuit 40 may be connected to the memory cell array 20 through the bit lines BLs, and may perform a program operation or a read operation based on a page buffer control signal CTRL_PB received from the control logic 60. The page buffer circuit 40 may be connected to data lines DLs by selecting the bit lines BLs by using a decoded column address.

The page buffer circuit 40 may include a plurality of page buffers for storing data to be programmed during a program operation or storing data to be read out during a read operation. Each of the plurality of page buffers may include a plurality of latches. During a program operation, data stored in the plurality of page buffers may be programmed into a page corresponding to a selected memory block through the bit lines BLs. During a read operation, data read out from a page corresponding to a selected memory block may be stored in the plurality of page buffers through the bit lines BLs. The page buffer circuit 40 may read data from a first area of the memory cell array 20 and store the read data in a second area of the memory cell array 20. The page buffer circuit 40 may perform, for example, a copy-back operation.

The voltage generator 50 may generate various types of voltages for performing a program operation, a read operation, and an erase operation with regard to the memory cell array 20 based on a voltage control signal CTRL_vol. For example, the voltage generator 50 may generate a word line operating voltage VWL to operate the word lines WLs. At this time, a first operating voltage VWL may be a program voltage (or a write voltage), a read voltage, an erase voltage, an inhibit voltage, or a program verify voltage. The voltage generator 50 may further generate a string select line operating voltage VSSL for operating a plurality of string select lines SSL and a ground select line operating voltage VGSL for operating a plurality of ground select lines GSL.

The control logic 60 may output various internal control signals for storing data in the memory cell array 20 or reading out data from the memory cell array 20, based on a command CMD, an address ADDR, and a control signal CTRL received from a memory controller. The control logic 60 may control the overall operations of the internal components of the non-volatile memory device 1. Various internal control signals output from the control logic 60 may be provided to the row decoder 30, the voltage generator 50, the page buffer circuit 40, and the data input/output circuit 10. For example, the control logic 60 may provide a row address X-ADDR to the row decoder 30, a voltage control signal CTRL_vol to the voltage generator 50, a page buffer control signal CTRL_PB to the page buffer circuit 40, and an output control signal CTRL_O to the data input/output circuit 10. In one embodiment, the control logic 60 may provide these and/or other internal control signals. For example, the control logic 60 may provide a column address to a column decoder. The control logic 60 may further include a clock signal generator that generates a clock signal.

The control logic 60 may provide an output control signal CTRL_O to the data input/output circuit 10. The output control signal CTRL_O may include information regarding a level of a power supply voltage used in the non-volatile memory device 1 and information regarding an operating frequency of the non-volatile memory device 1 (e.g., a clock signal).

The data input/output circuit 10 may be connected to at least one page buffer circuit 40 via the data lines DLs. During a data read operation, the data input/output circuit 10 may output read data to the page buffer circuit 40 to an external destination through the data lines DLs.

The data input/output circuit 10 may include a data output circuit 100 that operates according to the output control signal CTRL_O output by the control logic 60. The data output circuit 100 may transmit a data signal DQ to a memory controller.

Figure 2:
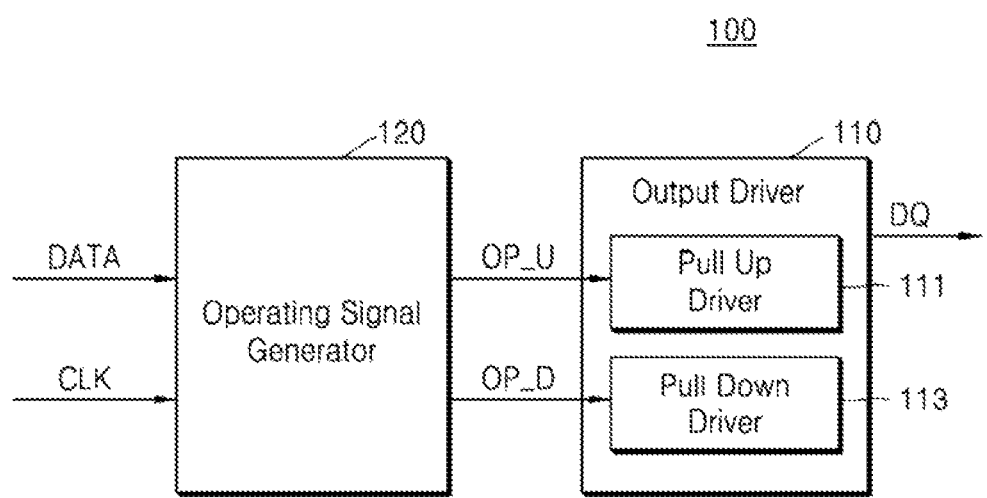
FIG. 2 illustrates an embodiment of a data output circuit.

FIG. 2 illustrates an embodiment of a data output circuit 100, which may be an example of the data input/output circuit 10 of FIG. 1.

Referring to FIGS. 1 and 2, the data output circuit 100 may include an output driver 110 and an operating signal generator 120. The data output circuit 100 may receive internal data DATA via the data lines DLs, and receive a clock signal CLK from the control logic 60. The data output circuit 100 may receive internal data DATA and output the data signal DQ under the control of the control logic 60. The data signal DQ may have high and low levels depending on the clock signal CLK and internal data DATA. The data signal DQ may be an AC-type signal swinging between a high-level output voltage and a low-level output voltage.

The output driver 110 may include a pull-up driver 111 for generating a current determined according to a pull-up operating signal OP_U, and a pull-down driver 113 having a resistance determined according to a pull-down operating signal OP_D. The pull-up driver 111 may include a first pull-up driver having a plurality of P-type transistors, and a second pull-up driver having a plurality of N-type transistors. The pull-down driver 113 may include a pull-down transistor including a plurality of N-type transistors.

The operating signal generator 120 may output the pull-up operating signal OP_U and the pull-down operating signal OP_D based on the internal data DATA and the clock signal CLK. The pull-up operating signal OP_U may be a code for changing a current generated by the pull-up driver 111 of the output driver 110. The pull-down operating signal OP_D may be a code for changing an amount of a current flowing to the pull-down driver 113 of the output driver 110. Therefore, the ON resistance of the output driver 110 may be adjusted according to the pull-up operating signal OP_U and the pull-down operating signal OP_D.

The pull-up driver 111 and the pull-down driver 113 may be turned ON alternately. When the pull-up driver 111 is operating, a high-level data signal DQ may be output. When the pull-down driver 113 is operating, a low-level data signal DQ may be output. For example, the operating signal generator 120 may generate the pull-up operating signal OP_U capable of turning ON all transistors in the pull-up driver 111 and, at the same time, generate the pull-down operating signal OP_D capable of turning OFF all transistors in the pull-down driver 113.

For example, when the output driver 110 outputs the data signal DQ, the operating signal generator 120 may change the amount of each current flowing to the pull-up driver 111 and the pull-down driver 113, thereby determining respective resistances of the pull-up driver 111 and the pull-down driver 113.

Figure 3:
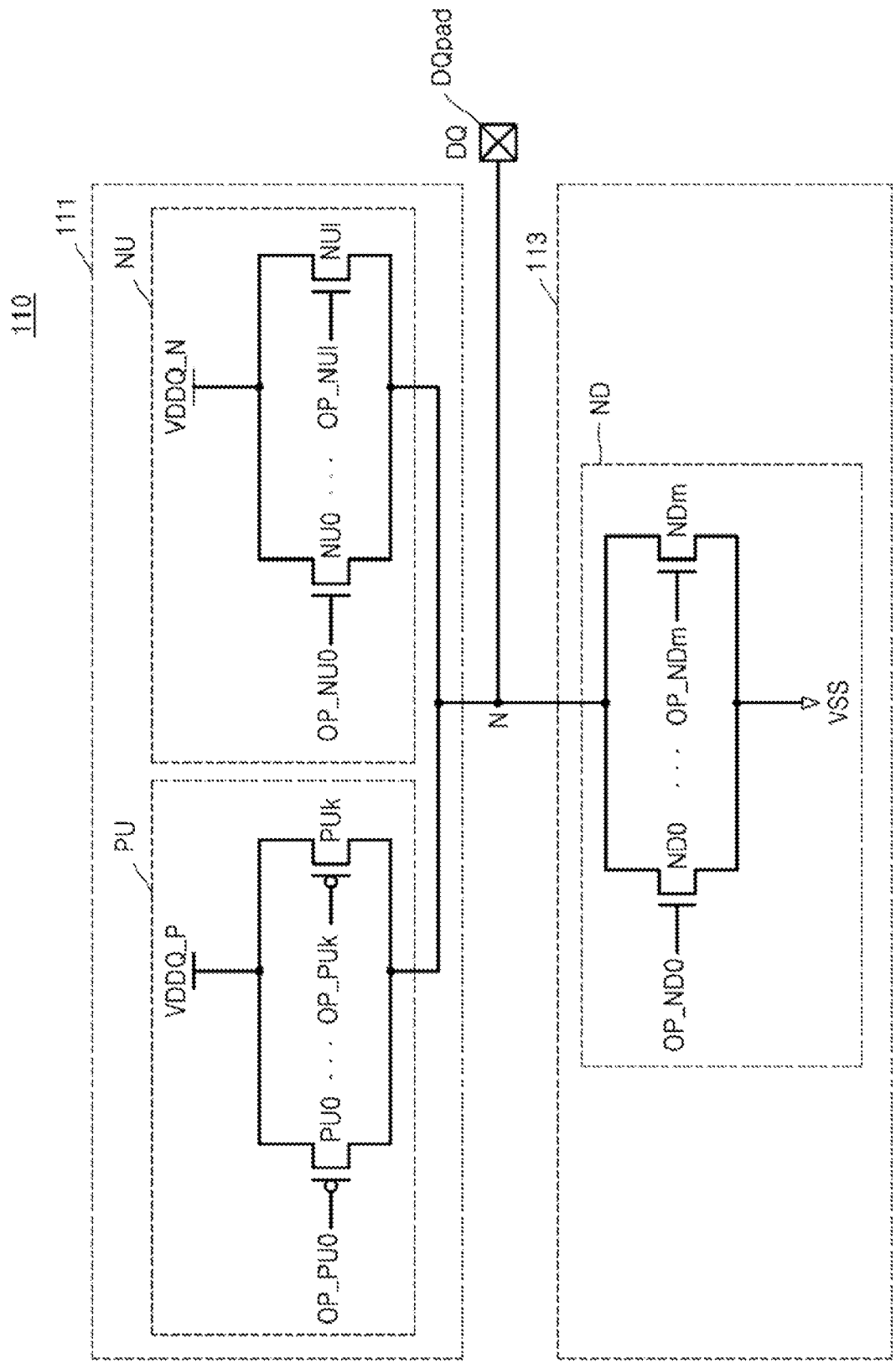
FIG. 3 illustrates an embodiment of an output driver.

FIG. 3 illustrates a circuit embodiment of the output driver 110 of FIG. 2, which may include the pull-up driver 111 and the pull-down driver 113.

The pull-up driver 111 may include a first pull-up driver PU connected between a first power supply voltage VDDQ_P and a node N, and a second pull-up driver NU connected between a second power supply voltage VDDQ_N and the node N. At this time, the first power supply voltage VDDQ_P and the second power supply voltage VDDQ_N may have a same level or may have different levels. For example, the voltage level of the first power supply voltage VDDQ_P may be higher than that of the second power supply voltage VDDQ_N.

The first pull-up driver PU may include $0^{th}$ through $k^{th}$ pull-up transistors PU0 through PUk. In this case, k is a natural number. The $0^{th}$ through $k^{th}$ pull-up transistors PU0 through PUk of the first pull-up driver PU may be implemented as P-type transistors.

The second pull-up driver NU may include the $0^{th}$ through $1^{th}$ pull-up transistors NU0 through NU1. In this case, 1 is a natural number. The $0^{th}$ through $1^{th}$ pull-up transistors NU0 through NU1 of the second pull-up driver NU may be implemented as N-type transistors, respectively.

The pull-down driver 113 may include $0^{th}$ through $m^{th}$ pull-down transistors ND0 through NDm connected between a ground voltage VSS and the node N, where m is a natural number. The $0^{th}$ through $m^{th}$ pull-down transistors ND0 through NDm may be implemented as N-type transistors.

The pull-up driver 111 may generate a current determined according to the pull-up operating signal OP_U. The first pull-up driver PU and the second pull-up driver NU may receive the pull-up operating signal OP_U from the operating signal generator 120. As a result, ON and OFF states of k transistors and l transistors may be adjusted. An amount of current flowing through the pull-up driver 111 may be adjusted depending on ON and OFF states of the k transistors in the first pull-up driver PU and the l transistors included in the second pull-up driver NU.

The pull-up operating signal OP_U includes a plurality of first pull-up operating signals OP_PU0 through OP_PUk input to the 0th through $k^{th}$ pull-up transistors PU0 through PUk of the first pull-up driver PU, and a plurality of second pull-up operating signals OP_NU0 through OP_NU1 input to the $0^{th}$ through $1^{th}$ pull-up transistors NU0 through NU1 of the second pull-up driver NU.

When the plurality of second pull-up operating signals OP_NU0 through OP_NU1 are at the high level, the voltage levels of the second pull-up operating signals OP_NU0 through OP_NU1 may be identical to that of the second power supply voltage VDDQ_N. In one embodiment, each of the voltage levels of the plurality of second pull-up operating signals OP_NU0 through OP_NU1 when the plurality of second pull-up operating signals OP_NU0 through OP_NU1 are at the high level may be higher than that of the second power supply voltage VDDQ_N. For example, the plurality of second pull-up operating signals OP_NU0 through OP_NU1 may be generated based on a voltage, which is generated by a voltage generator (e.g., the voltage generator 50 in FIG. 1) in a non-volatile memory device and boosted, or a voltage input from an external device (e.g., a memory controller).

The ON and OFF states of the $0^{th}$ through $m^{th}$ transistors ND0 through NDm may be switched according to the pull-down operating signal OP_D input to the pull-down driver 113. The pull-down operating signal OP_D may include a plurality of pull-down operating signals OP_ND0 through OP_NDm respectively input to the $0^{th}$ through $m^{th}$ pull-down transistors ND0 through NDm. Furthermore, an amount of a current flowing in the pull-down driver 113 may be adjusted according to the ON/OFF state of each of the m transistors. Therefore, as each of the currents flowing to the pull-up driver 111 and the pull-down driver 113 is adjusted, the output driver 110 may have a specific resistance corresponding to the current, and the data signal may be transmitted to a memory controller via a DQ pad.

When the plurality of pull-down operating signals OP_ND0 through OP_NDm are at the high level, each of the voltage levels of the plurality of pull-down operating signals OP_ND0 through OP_NDm may be identical to that of the first power supply voltage VDDQ_P or the second power supply voltage VDDQ_N. In one embodiment, each of the voltage levels of the plurality of second pull-down operating signals OP_ND0 through OP_NDm, when the plurality of second pull-down operating signals OP_ND0 through OP_NDm are at the high level, may be higher than those of the first power supply voltage VDDQ_P and the second power supply voltage VDDQ_N. For example, the plurality of second pull-down operating signals OP_ND0 through OP_NDm may be generated based on a voltage (which is generated by a voltage generator in a non-volatile memory device and boosted) or a voltage input from an external device (e.g., a memory controller).

In an example embodiment, the pull-up driver 111 includes the first pull-up driver PU including P-type transistors and the second pull-up driver NU including N-type transistors. A range of levels of a power supply voltage VCCQ used for operating the pull-up driver 111 may be widened.

Figure 4A:
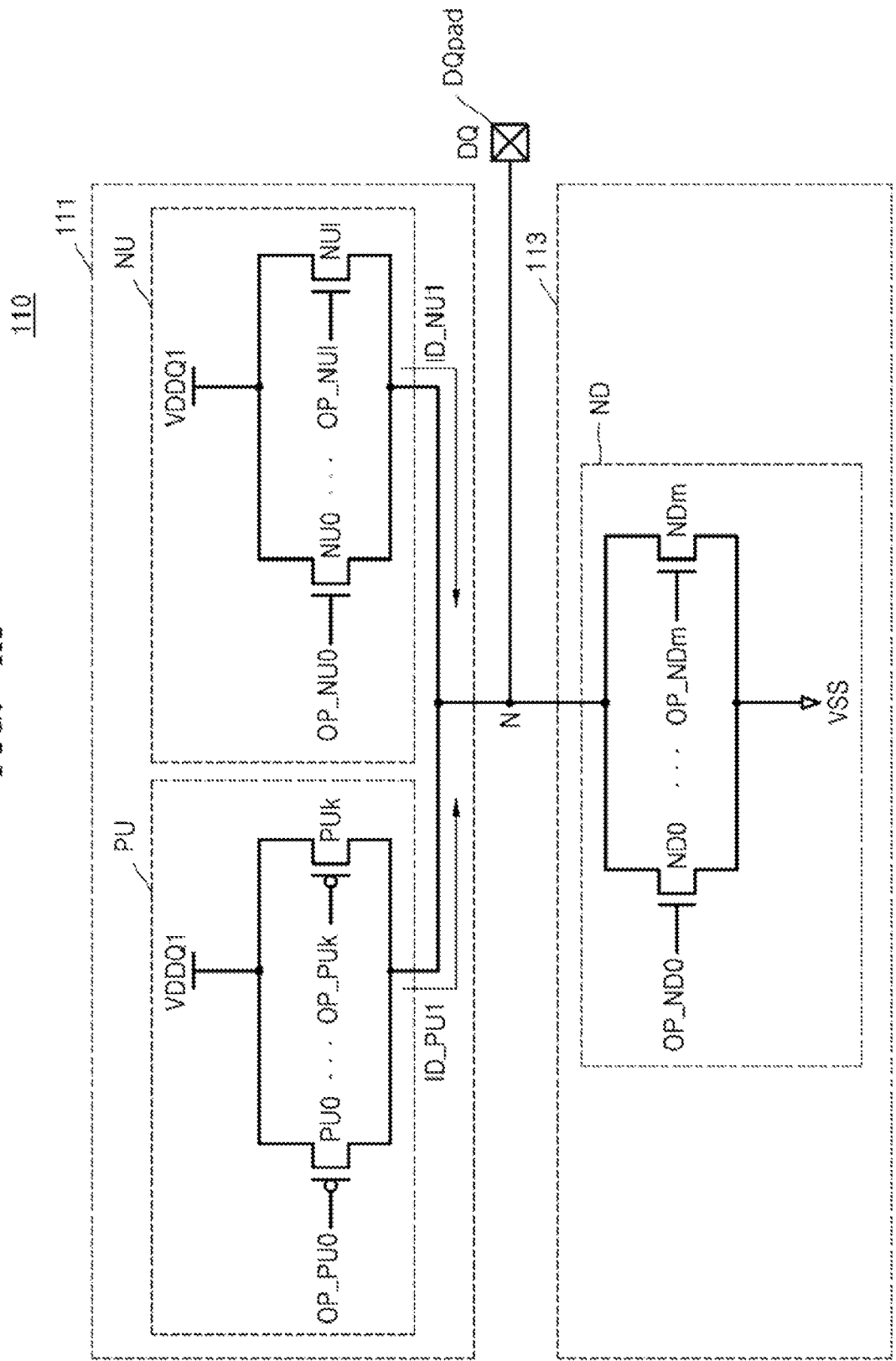
FIGS. 4A and 4B illustrate embodiments of operating mechanisms of a pull-up driver according to voltage levels of a power supply voltage.
Figure 4B:
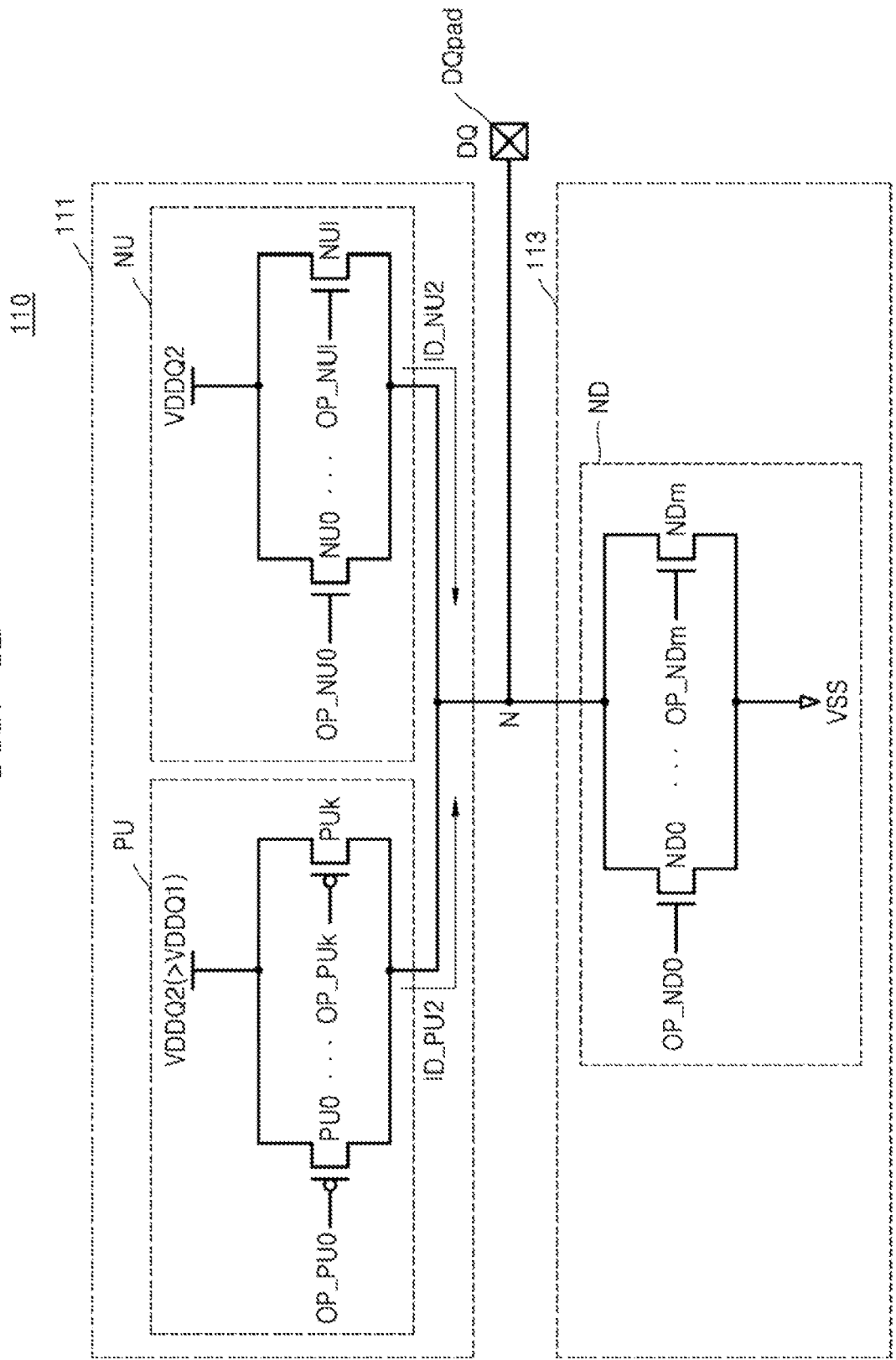

Furthermore, since the pull-up driver 111 includes both the P-type transistors and the N-type transistors, a current generated by the pull-up driver 111 with respect to a data output voltage VDQ of the DQ pad connected to the node N may be linear as a result of characteristics of the P-type transistors and the N-type transistors FIGS. 4A and 4B illustrate circuit embodiments for comparing and describing operating mechanisms of a pull-up driver according to voltage levels of a power supply voltage.

Referring to FIG. 4A, the pull-up driver 111 may include the first pull-up driver PU including P-type transistors PU0 through PUk and the second pull-up driver NU including N-type transistors NU0 through NU1. Low power supply voltages VDDQ1 having a same voltage level may be applied to the first pull-up driver PU and the second pull-up driver NU, respectively. A low power supply voltage VDDQ1 may refer to a power supply voltage having a relatively low voltage level, and in one embodiment, may have a voltage level lower than that of a high power supply voltage VDDQ2 of FIG. 4B described below.

For the P-type transistors PU0 through PUk to be turned ON, due to characteristics of P-type transistors, differences between the voltage level of the low power supply voltage VDDQ1 and the voltage levels of the plurality of first pull-up operating signals OP_PU0 through OP-PUk input to turn ON the P-type transistors PU0 through PUk may be greater than the respective threshold voltages of the P-type transistors PU0 through PUk. The threshold voltages of the P-type transistors PU0 through PUk may vary according to recipes of processes for fabricating the respective P-type transistors PU0 through PUk. The threshold voltages of the P-type transistors PU0 through PUk may differ from one another. Therefore, when the low power supply voltage VDDQ1 having a relatively low voltage level is applied, at least some of the P-type transistors PU0 through PUk may not be turned ON.

The N-type transistors NU0 through NU1 may be normally turned ON even when the low power supply voltage VDDQ1 having a voltage level lower than a certain level is applied, because conditions for turning ON the N-type transistors NU0 through NU1 are satisfied.

Therefore, even when a relatively low power supply voltage (e.g., the low power supply voltage VDDQ1) is applied to the pull-up driver 111 in the non-volatile memory device according to an example embodiment and a current ID_PU1 output by the first pull-up driver PU is insufficient, the current ID_PU1 may be supplemented by a current ID_NU1 output by the second pull-up driver NU.

Referring to FIG. 4B, the high power supply voltage VDDQ2 having a relatively high voltage level may be applied to the pull-up driver 111. The high power supply voltages VDDQ2 having a same voltage level may be applied to the first pull-up driver PU and the second pull-up driver NU, respectively. The high power supply voltage VDDQ2 may refer to a power supply voltage having a relatively high voltage level, and in one embodiment, may have a voltage level higher than that of the low power supply voltage VDDQ1 of FIG. 4A.

For the N-type transistors NU0 through NU1 to be turned ON, due to characteristics of P-type transistors, differences between the voltage levels of the plurality of second pull-up operating signals OP_NU0 through OP-NU1 input to turn ON the N-type transistors NU0 through NU1 and the voltage level of the data signal DQ may be greater than the respective threshold voltages of the N-type transistors NU0 through NU1. When the high power supply voltage VDDQ2 having a relatively high voltage level is applied, at least some of the N-type transistors NU0 through NU1 may not be turned ON.

The P-type transistors PU0 through PUk may be normally turned ON even when the high power supply voltage VDDQ2 having a voltage level equal to or higher than a certain level is applied, because conditions for turning ON the P-type transistors PU0 through PUk are satisfied.

Therefore, even when a relatively high power supply voltage (e.g., the high power supply voltage VDDQ2 is applied to the pull-up driver 111 in the non-volatile memory device according to an example embodiment and a current ID_PU2 output by the second pull-up driver NU is insufficient, the current ID_PU2 may be supplemented by a current ID_PU2 output by the first pull-up driver NU.

A case where the power supply voltages VDDQ1 and VDDQ2 having a same voltage level are applied to the first pull-up driver PU and the second pull-up driver NU is described with reference to FIGS. 4A and 4B. In one embodiment, for example, power supply voltages having different voltage levels may be applied to the first pull-up driver PU and the second pull-up driver NU, respectively. For example, the high power supply voltage VDDQ2 may be applied to the first pull-up driver PU, and the low power supply voltage VDDQ1 may be applied to the second pull-up driver NU.

The low power supply voltage VDDQ1 and the high power supply voltage VDDQ2 applied to the pull-up driver 111 are merely examples. In one embodiment, power supply voltages having voltage levels of a wide range including the low power supply voltage VDDQ1 having a relatively low voltage level and the high power supply voltage VDDQ2 having a relatively high voltage level may be applied to the pull-up driver 111 in a non-volatile memory device according to an example embodiment.

Figure 5:
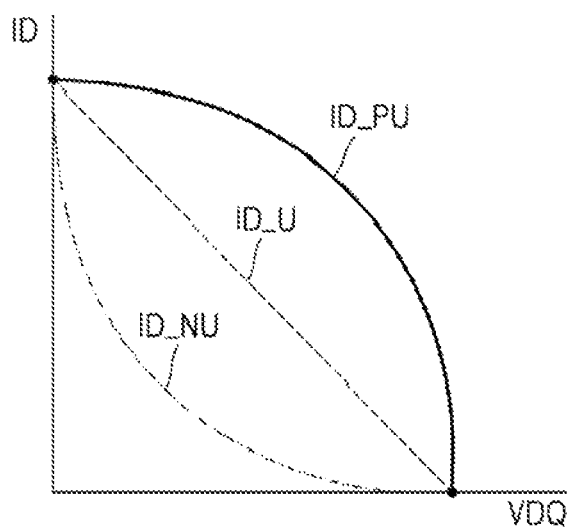
FIG. 5 illustrates an example of changes in magnitude of currents flowing to P-type transistors and N-type transistors in a pull-up driver.

FIG. 5 illustrates a graph showing examples of changes in magnitude of currents flowing to P-type transistors and N-type transistors in a pull-up driver.

Referring to FIGS. 3 and 5, due to differences between characteristics of the P-type transistors PU0 through PUk and characteristics of the N-type transistors NU0 through NU1, curves indicating changes of currents ID_PU and ID_NU respectively flowing to the P-type transistors PU0 through PUk and the N-type transistors NU0 through NU1 according to the data output voltage VDQ, which is the voltage level of the data signal DQ, may differ from each other.

The overall current ID U flowing to the pull-up driver 111 is a sum of the current ID_PU flowing to the P-type transistors PU0 through PUk and the current ID_NU flowing to the N-type transistors NU0 through NU1. Since the pull-up driver 111 includes both the P-type transistors PU0 through PUk and the N-type transistors NU0 through NU1, the current ID_U flowing to the pull-up driver 111 with respect to the output voltage VDQ may be linear. Therefore, the output driver 110, which includes the pull-up driver 111, may have a constant AC ON-resistance.

Figure 6:
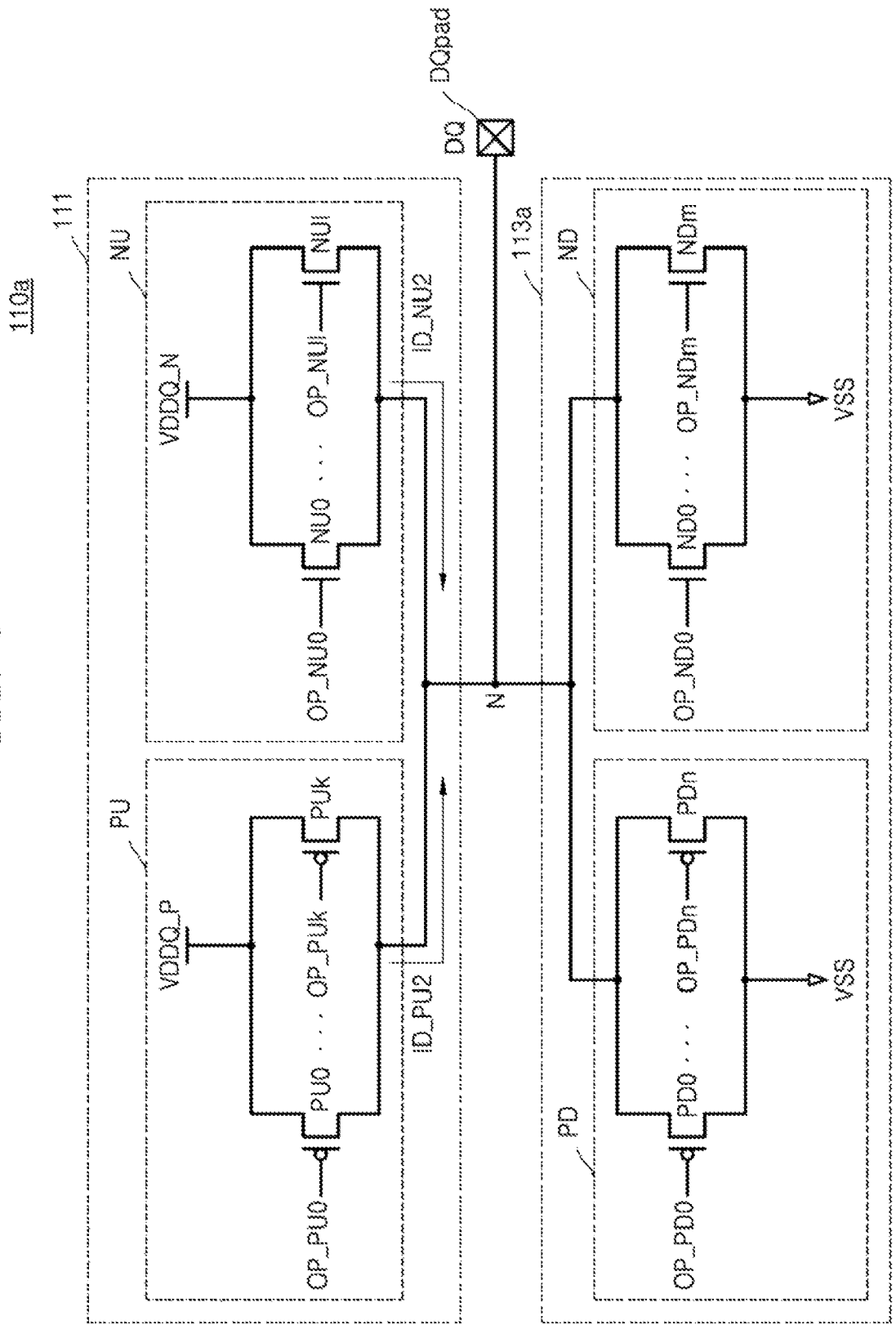
FIG. 6 illustrates another embodiment of an output driver.
Figure 7:
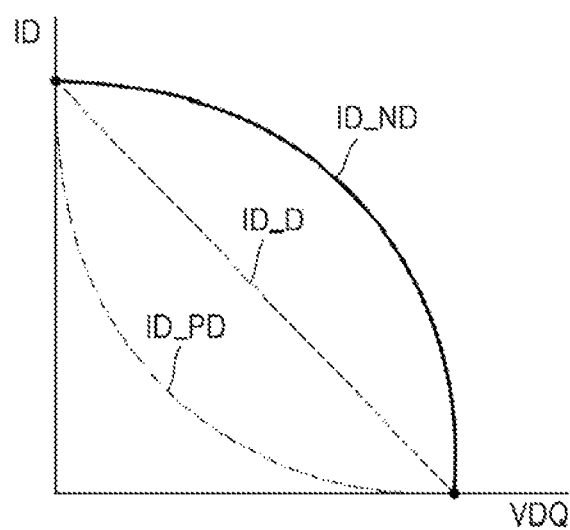
FIG. 7 illustrates an example of changes in magnitude of currents flowing to P-type transistors and N-type transistors in a pull-down driver.

FIG. 6 illustrates another embodiment of the output driver 110 of FIG. 2. FIG. 7 illustrates a graph showing an example of changes in magnitude of currents flowing to P-type transistors and N-type transistors in a pull-down driver according to data output voltages. Compared with the pull-down driver 113 of FIG. 3, a pull-down driver 113a may further include a plurality of P-type transistors.

Referring to FIGS. 2 and 6, the output driver 110 may include the pull-up driver 111 and the pull-down driver 113a. The pull-down driver 113a may include a first pull-down driver PD and a second pull-down driver ND connected between the ground voltage VSS and the node N. The first pull-down driver PD may include $0^{th}$ through $n^{th}$ pull-down transistors PD0 through PDn, where n is a natural number. Each of the $0^{th}$ through $n^{th}$ pull-down transistors PD0 through PDn may be a P-type transistor. The second pull-down driver ND may include $0^{th}$ through $m^{th}$ pull-down transistors ND0 through NDm, where m is a natural number. Each of the $0^{th}$ through $m^{th}$ pull-down transistors ND0 through NDm may be implemented as an N-type transistor.

When the internal data DATA is at a low level, the pull-down driver 113a may have a particular resistance value based on the pull-down operating signal OP_D. The pull-down operating signal OP_D may include a plurality of first pull-down operating signals OP_PD0 through OP_PDn input to the $0^{th}$ through $n^{th}$ pull-down transistors PD0 through PDn of the first pull-down driver PD, and a plurality of second pull-down operating signals OP_ND0 through OP_NDm input to the $0^{th}$ through $m^{th}$ pull-down transistors ND0 through NDm of second pull-down driver ND.

Referring to FIGS. 6 and 7, due to differences between characteristics of the P-type transistors PD0 through PDn and characteristics of the N-type transistors ND0 through NDm, curves indicating changes of currents ID_PD and ID_ND respectively flowing to the P-type transistors PD0 through PDn and the N-type transistors ND0 through NDm according to the data output voltage VDQ may differ from each other.

A current ID_D flowing to the pull-down driver 113a is a sum of the current ID_PD flowing to the P-type transistors PD0 through PDn and the current ID_ND flowing to the N-type transistors ND0 through NDm. Since the pull-down driver 113a includes both the P-type transistors PD0 through PDn and the N-type transistors ND0 through NDm, the current ID_D flowing to the pull-down driver 113a with respect to the data output voltage VDQ may be linear. The output driver 110a including the pull-up driver 111 and the pull-down driver 113a may have a constant AC ON-resistance.

Figure 8:
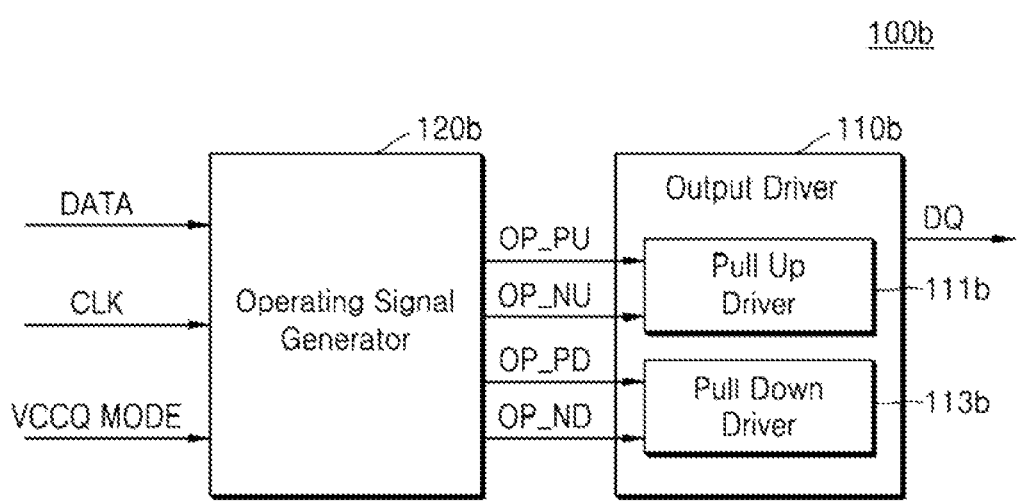
FIG. 8 illustrates another embodiment of a data output circuit.

FIG. 8 illustrates another example embodiment of the data output circuit 100b of FIG. 1. Referring to FIG. 8, a data output circuit 100b may include an output driver 110b and an operating signal generator 120b. The data output circuit 100b may receive internal data DATA via data lines (e.g., the data lines DLs in FIG. 1) and, based on the internal data DATA, output the data signal DQ under the control of a control logic (e.g., control logic 60 of FIG. 1).

The output driver 110b includes a pull-up driver 111b for generating a current determined according to pull-up operating signals OP_PU and OP_NU and a pull-down driver 113b having resistance determined based on pull-down signals OP_PD and OP_ND. The pull-up driver 111b may include a first pull-up driver including a plurality of P-type transistors and a second pull-up driver including a plurality of N-type transistors. The pull-down driver 113b may include a first pull-down driver including a plurality of P-type transistors and a second pull-down driver including a plurality of N-type transistors. The output driver 110b may have, for example, the same configuration as the output driver 110a of FIG. 6.

The operating signal generator 120b may output pull-up operating signals OP_PU and OP_NU and pull pull-down signals OPD_PD and OP_ND based on the internal data DATA and the information regarding a power supply voltage VCCQ MODE applied to the pull-up driver 111b. The information regarding a power supply voltage VCCQ MODE may be included in an output control signal (e.g., the output control signal CTRL_O) from a control logic (e.g., the control logic 60 in FIG. 1).

The pull-up operating signals OP_PU and OP_NU may include a first pull-up operating signal OP_PU and a second pull-up operating signal OP_NU. The first pull-up operating signal OP_PU may be an operating signal for operating the first pull-up driver and the second pull-up operating signal OP_NU may be an operating signal for operating the second pull-up driver.

The pull-down operating signals OP_PD and OP_ND may include a first pull-down operating signal OP_PD and a second pull-down operating signal OP_ND. The first pull-down operating signal OP_PD may be an operating signal for operating the first pull-down driver. The second pull-down operating signal OP_ND may be an operating signal for operating the second pull-down driver.

The operating signal generator 120b may selectively turn OFF one of the first pull-up driver and the second pull-up driver in the pull-up driver 111b and may generate pull-up operating signals OP_PU and OP_NU corresponding thereto. Furthermore, the operating signal generator 120b may selectively turn OFF one of the first pull-down driver and the second pull-down driver in the pull-down driver 113b and may generate pull-down operating signals OP_PD and OP_ND corresponding thereto.

Figure 9A:
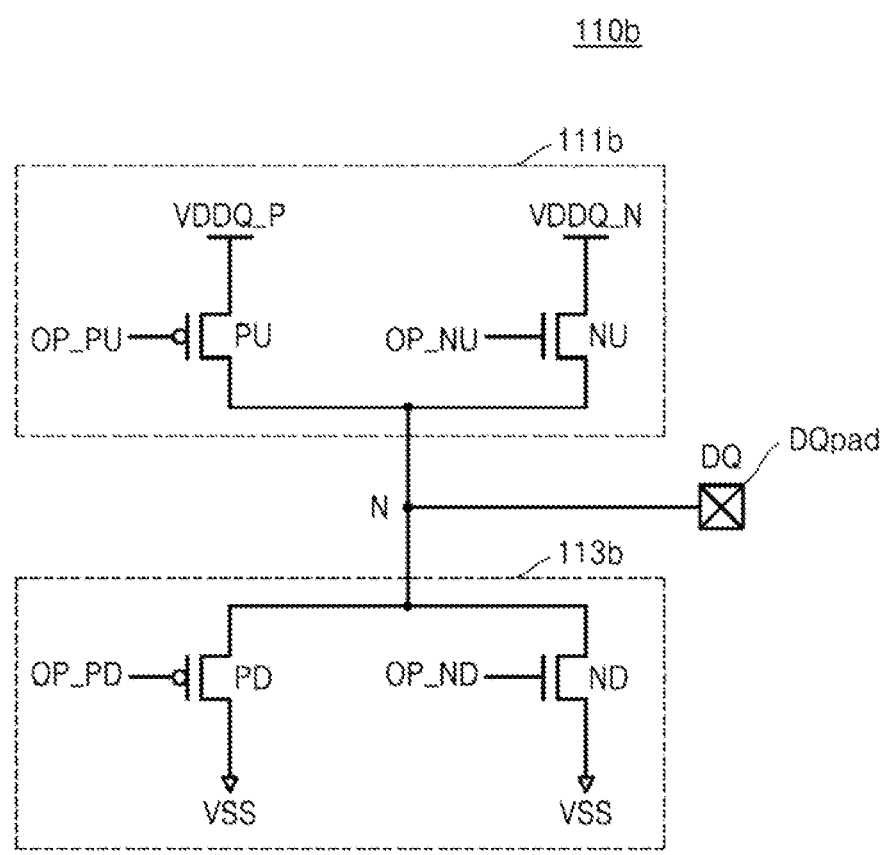
FIGS. 9A, 10A, 11A, and 12A illustrate embodiments of the output driver of FIG. 6.
Figure 9B:
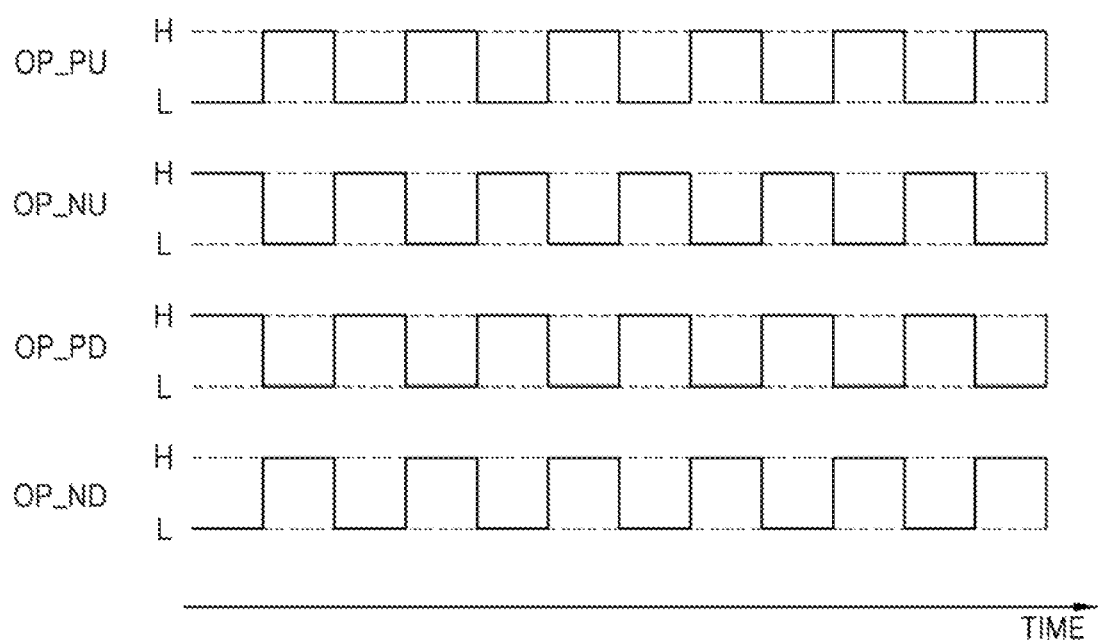
FIGS. 9B, 10B, 11B, and 12B illustrate embodiments of operating signals for the output drivers of FIGS. 9A, 10A, 11A, and 12A, respectively.

FIG. 9A illustrates an embodiment of the output driver of FIG. 6 which includes four equivalent transistors which are all operated. FIG. 9B illustrates an embodiment of a timing diagram including operating signals that may be input into the output driver of FIG. 9A.

Referring to FIGS. 8, 9A, and 9B, the first pull-up driver PU of the pull-up driver 111b may be indicated as one equivalent P-type transistor, and the second pull-up driver NU may be indicated as one equivalent N-type transistor. The first pull-down driver PD of the pull-down driver 113b may be indicated as one equivalent P-type transistor. The second pull-down driver ND may be indicated as one equivalent N-type transistor.

The operating signal generator 120b may output the pull-up operating signals OP_PU and OP NU and the pull-down operating signals OP_PD and OP_ND based on the internal data DATA and a code regarding the information regarding a power supply voltage VCCQ MODE applied to the pull-up driver 111b and an output driver 110b.

According to an example embodiment, when power supply voltages applied to the first pull-up driver PU and the second pull-up driver NU respectively satisfy conditions for the first pull-up driver PU and the second pull-up driver NU to be normally operated, the operating signal generator 120b may generate pull-up operating signals OP_PU and OP_NU toggling between a high level H and a low level L based on the internal data DATA. Furthermore, the operating signal generator 120b may generate pull-down operating signals OP_PD and OP_ND toggling between the high level H and the low level L.

Therefore, current flowing to the pull-up driver 111b and current flowing to the pull-down driver 113b with respect to the data output voltage VDQ may be linear.

In one embodiment, when the operating signal generator 120b generates an operating signal toggling between the high level H and the low level L, the operating signal generator 120b operates the pull-up driver 111b or the pull-down driver 113b that receives the toggling operating signal. For example, when the operating signal generator 120b generates an operating signal toggling between the high level H and the low level L with respect to at least one of the plurality of P-type transistors in the first pull-up driver PU, the operating signal generator 120b may be considered to operate the first pull-up driver PU. The same description may be applied to the second pull-up driver NU, the first pull-down driver PD, and the second pull-down driver ND.

Figure 10A:
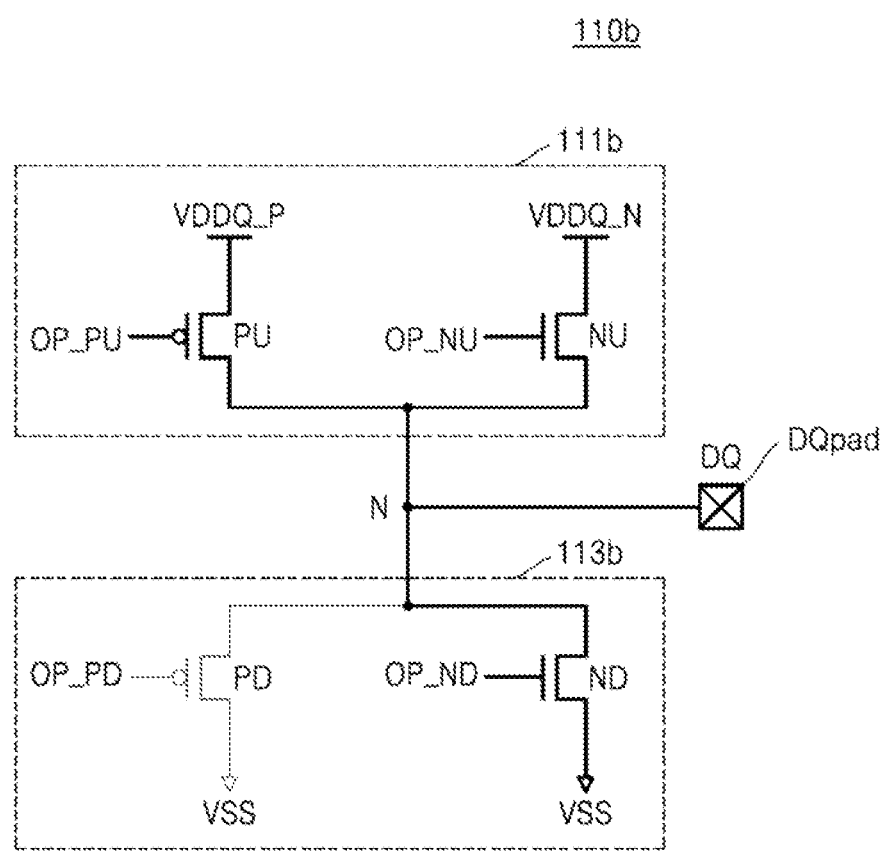
Figure 10B:
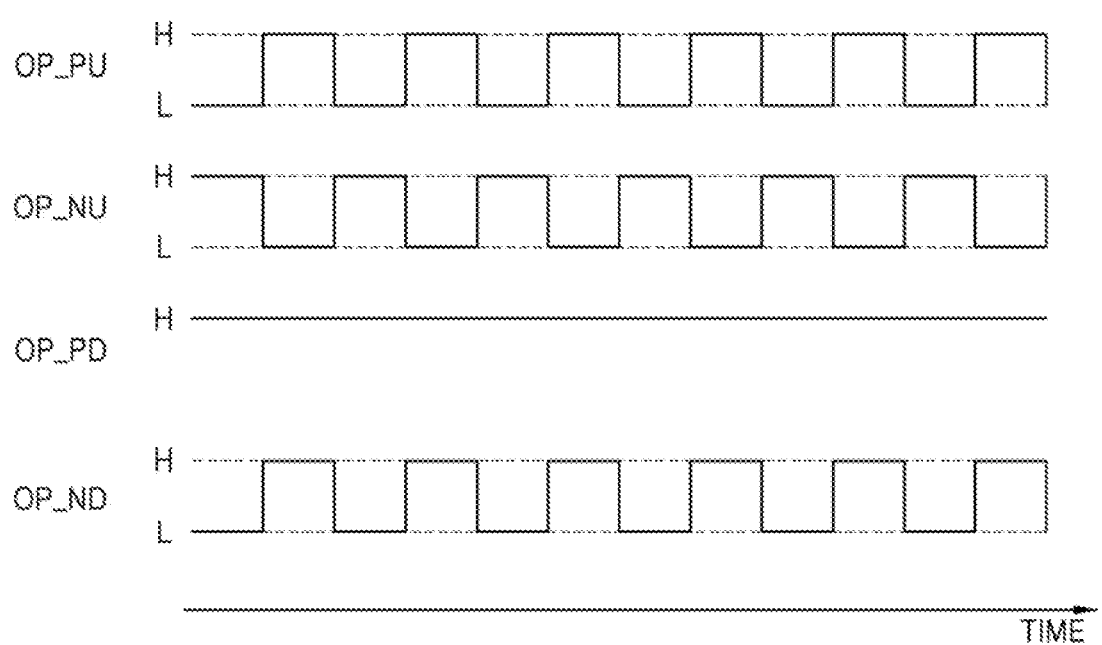

FIG. 10A illustrates another embodiment of the output driver of FIG. 6 which includes four equivalent transistors, one or more of which are not operated. FIG. 10B illustrates an embodiment of a timing diagram including operating signals input to the output driver of FIG. 10A.

Referring to FIGS. 8, 10A, and 10B, the operating signal generator 120b may selectively operate at least one of the first pull-up driver PU and the second pull-up driver PU of the pull-up driver 111b. For example, the operating signal generator 120b may output a pull-up operating signal OP_PU or OP_NU to one of the first pull-up driver PU and the second pull-up driver NU to turn OFF the first pull-up driver PU or the second pull-up driver NU.

The operating signal generator 120b may selectively operate at least one of the first pull-down driver PD and the second pull-down driver ND of the pull-down driver 113b. For example, the operating signal generator 120b may output a pull-down operating signal OP_PD or OP_ND to one of the first pull-down driver PD and the second pull-down driver ND to turn OFF the first pull-down driver PD or the second pull-down driver ND.

When power supply voltages applied to the first pull-up driver PU and the second pull-up driver NU respectively satisfy conditions for the first pull-up driver PU and the second pull-up driver NU to be normally operated, the operating signal generator 120b may generate pull-up operating signals OP_PU and OP_NU toggling between the high level H and the low level L based on the internal data DATA.

The operating signal generator 120b may normally operate only the second pull-down driver ND from between the first pull-down driver PD and the second pull-down driver ND. Based on the internal data DATA, the operating signal generator 120b may generate the second pull-down operating signal OP_ND toggling between the high level H and the low level and the first pull-down operating signal OP_PD having the high level H. Therefore, the power consumption at the output driver 110b may be reduced. In some cases, the operating signal generator 120b may normally operate only the first pull-down driver PD from between the first pull-down driver PD and the second pull-down driver ND.

Figure 11A:
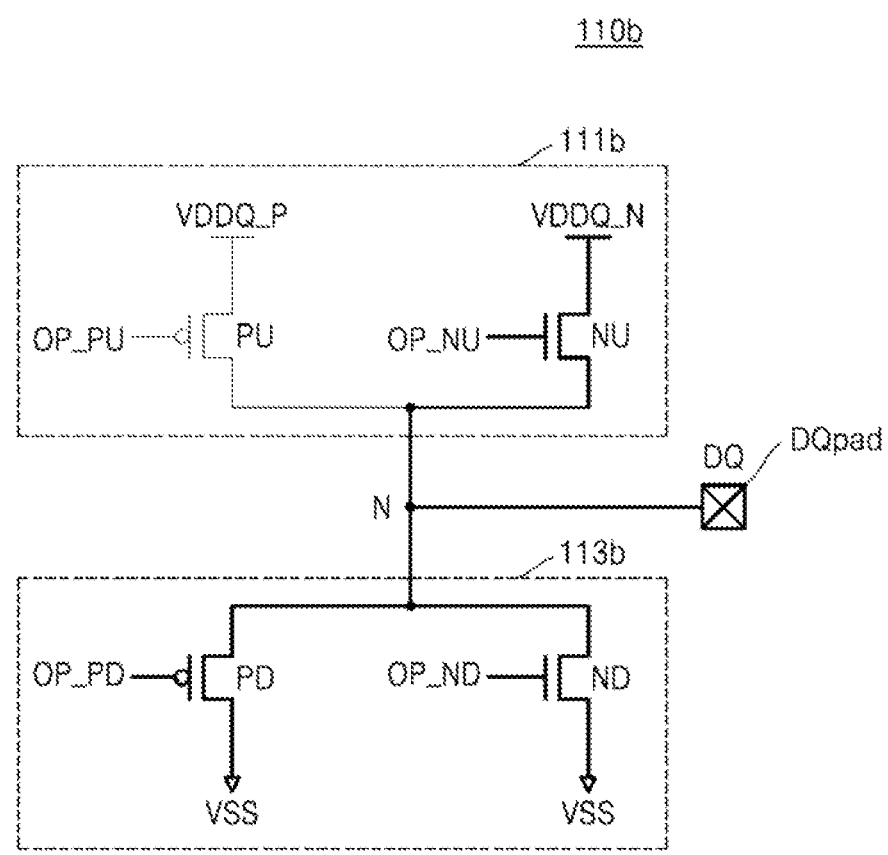
Figure 11B:
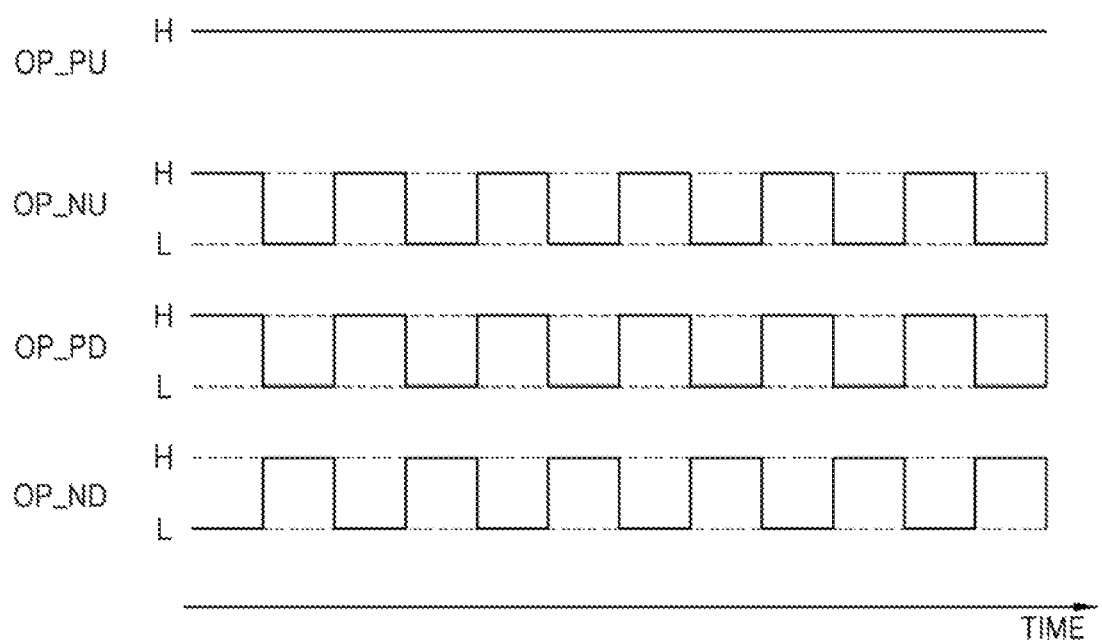

FIG. 11A illustrates another embodiment of the output driver of FIG. 6 which includes four equivalent transistors, where some of the four equivalent transistors are not operated. FIG. 11B illustrates an embodiment of a timing diagram which includes operating signals input to the output driver of FIG. 11A.

Referring to FIGS. 8, 11A, and 11B, a power supply voltage applied to the second pull-up driver NU may satisfy a condition for the second pull-up driver NU to operate normally, but a power supply voltage applied to the PU may not satisfy a condition for the first pull-up driver PU to operate normally. For example, the low power supply voltage VDDQ1 of FIG. 4A may be applied to first pull-up driver PU. The operating signal generator 120b may normally operate only the second pull-up driver NU from between the first pull-up driver PU and the second pull-up driver NU in the output driver 110b. Therefore, the operating signal generator 120b may generate the second pull-up operating signal OP_NU toggling between the high level H and the low level L based on the internal data DATA, and may generate the first pull-up operating signal OP_PU having the high level H. Since only the second pull-up driver NU is normally operated, power consumed by the output driver 110b may be reduced.

In one embodiment, when a power supply voltage applied to the second pull-up driver NU does not satisfy a condition for the second pull-up driver NU to operate normally (e.g., when the high power supply voltage VDDQ2 of FIG. 4B is applied to second pull-up driver NU), the operating signal generator 120b may generate the first pull-up operating signal OP_PU toggling between the high level H and the low level L based on the internal data DATA, and may generate the second pull-up operating signal OP_NU having the low level L.

The operating signal generator 120b may generate the pull-down operating signals OP_PD and OP_ND toggling between the high level H and the low level L, such that the current ID_D flowing to the pull-down driver 113b with respect to the output voltage VDQ has linearity.

Figure 12A:
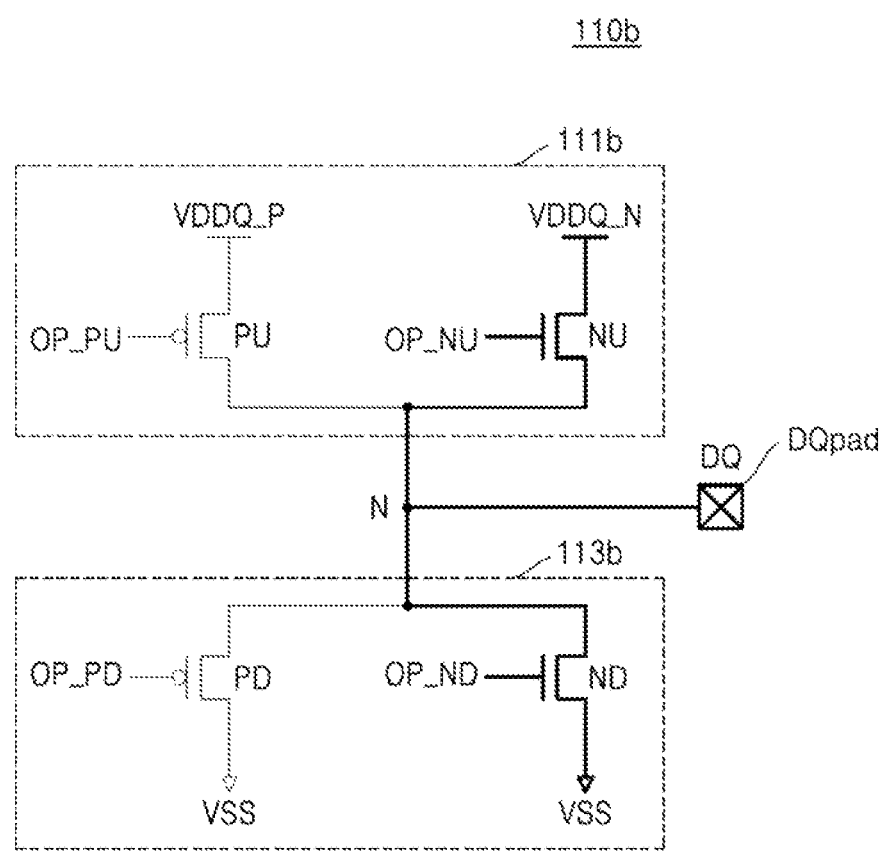
Figure 12B:
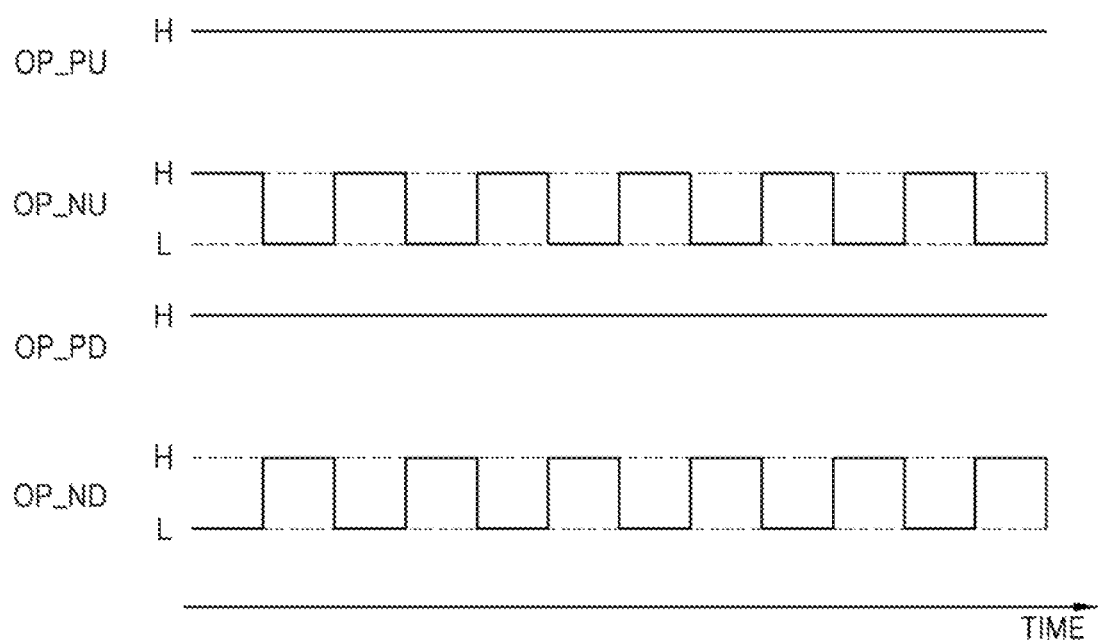

FIG. 12A illustrates another embodiment of the output driver of FIG. 6 which includes four equivalent transistors, some of which are not operated. FIG. 12B illustrates an embodiment of a timing diagram which includes operating signals input to the output driver of FIG. 12A.

Referring to FIGS. 8, 12A, and 12B, the operating signal generator 120b may selectively operate only one of the first pull-up driver PU and the second pull-up driver NU of the pull-up driver 111b. The operating signal generator 120b may selectively operate only one of the first pull-down driver PD and the second pull-down driver ND of the pull-down driver 113b. Therefore, power consumed by the operating signal generator 120b may be reduced.

According to an example embodiment, when the low power supply voltage VDDQ1 of FIG. 4A is applied to the operating signal generator 120b, the operating signal generator 120b may only operate the second pull-up driver NU. According to another example embodiment, when the high power supply voltage VDDQ2 of FIG. 4B is applied to the operating signal generator 120b, the operating signal generator 120b may only operate the first pull-up driver (PU).

Referring to FIGS. 9A through 12B, a data output circuit according to an example embodiment may selectively operate the first pull-up driver PU, the second pull-up driver NU, the first pull-down driver PD, and the second pull-down driver ND in the output driver 110b. Therefore, the linearity of current flowing to the output driver 110b according to the data output voltage VDQ may be secured, thereby maintaining a constant ON resistance or reducing power consumed by the output driver 110b. In some cases, the first pull-up driver PU, the second pull-up driver NU, the first pull-down driver PD, and the second pull-down driver ND of the output driver 110b may be selectively operated for higher efficiency.

Examples of the output driver 110b including the first pull-up driver PU, the second pull-up driver NU, the first pull-down driver PD, and the second pull-down driver ND has been described above with reference to FIGS. 9A through 12B. A similar description may be applied to the output driver 110 of FIG. 3.

Figure 13:
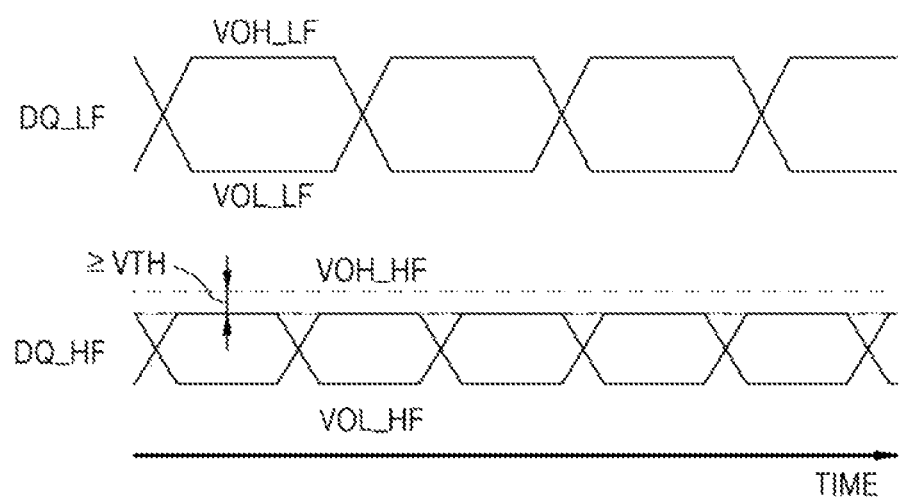
FIG. 13 illustrates an embodiment of data signals and operation speeds for an output driver.

FIG. 13 illustrates an embodiment of a timing diagram which includes data signals according to operation speeds that correspond to operation of an output driver.

Referring to FIGS. 6 and 13, data signals DQ_LF and DQ_HF may have a high level and a low level according to the internal data DATA. The data signals DQ_LF and DQ_HF may be AC-type signals swinging between high-level output voltages VOH_LF and VOH_HF and low-level output voltages VOL_LF and VOL_HF. The data signals DQ_LF and DQ_HF may swing in different forms depending on operation speeds of the data output circuit (e.g., the data output circuit 100 in FIG. 2 or the data output circuit 100b in FIG. 8).

For example, when a clock signal having a relatively high frequency is input from a control circuit (e.g., the control logic 60 in FIG. 1) to a data output circuit, there may not be enough time for the data signal DQ_HF to swing sufficiently. As a result, a memory controller that receives the data signal DQ_HF may inaccurately determine a received data value (0 or 1) based on a comparison of the data signal DQ_HF with a reference voltage. Therefore, swinging form of the data signal DQ_HF may improve reliability of the data signal DQ_HF. Termination may be applied to complete the swinging form of the data signal DQ_HF having a high frequency.

Due to characteristics of an N-type transistor, the level of a source voltage may be less than or equal to a difference between a voltage level of a voltage applied to a gate and a threshold voltage of the N-type transistor. Therefore, as shown in FIGS. 11A, 11B, 12A, and 12B, according to an example embodiment, an operating signal generator (e.g., the operating signal generator 120b of FIG. 8) may operate only the second pull-up driver NU from between the first pull-up driver PU and the second pull-up driver NU. For example, the operating signal generator may generate the second pull-up operating signal OP_NU toggling between a high level voltage H and a low level voltage L based on the internal data DATA and generate the first pull-up operating signal OP_PU having the high level H When only the second pull-up driver NU is operated, the voltage level of the data signal DQ_HF may be less than or equal to a difference between the voltage level of the second pull-up operating signal OP_PU and a threshold voltage VTH of an equivalent N-type transistor. Therefore, when the second pull-up operating signal OP_PU is at a high level, the operating signal generator may generate the second pull-up operating signal OP_PU to have a same voltage level as the second power supply voltage VDDQ_N. Thus, an effect for applying termination that reduces the voltage level of the data signal DQ_HF by more than the voltage level of the threshold voltage VTH may occur.

On the other hand, when a clock signal having a relatively low frequency is input from a control circuit to the data output circuit, the data signal DQ_LF may swing sufficiently. Therefore, as shown in FIGS. 9A, 9B, 10A, and 10B, the operating signal generator may operate both the first pull-up driver PU and the second pull-up driver NU. In one embodiment, only one of the first pull-up driver PU and the second pull-up driver NU may be operated.

It has been described above with reference to FIG. 13 that the output driver 110b is operated differently according to operation speeds of the data output circuit. In one embodiment, the aforementioned description may be similarly applied even when an effect of reducing a voltage level of a data signal by more than a voltage level of the threshold voltage VTH level (termination) is to be performed.

The data output circuit according to an example embodiment may selectively operate the first pull-up driver PU, the second pull-up driver NU, the first pull-down driver PD, and the second pull-down driver ND included therein based on a frequency of a clock signal input to the data output circuit. Therefore, even when high-speed operation is needed, the reliability of a data signal may be maintained.

Figure 14:
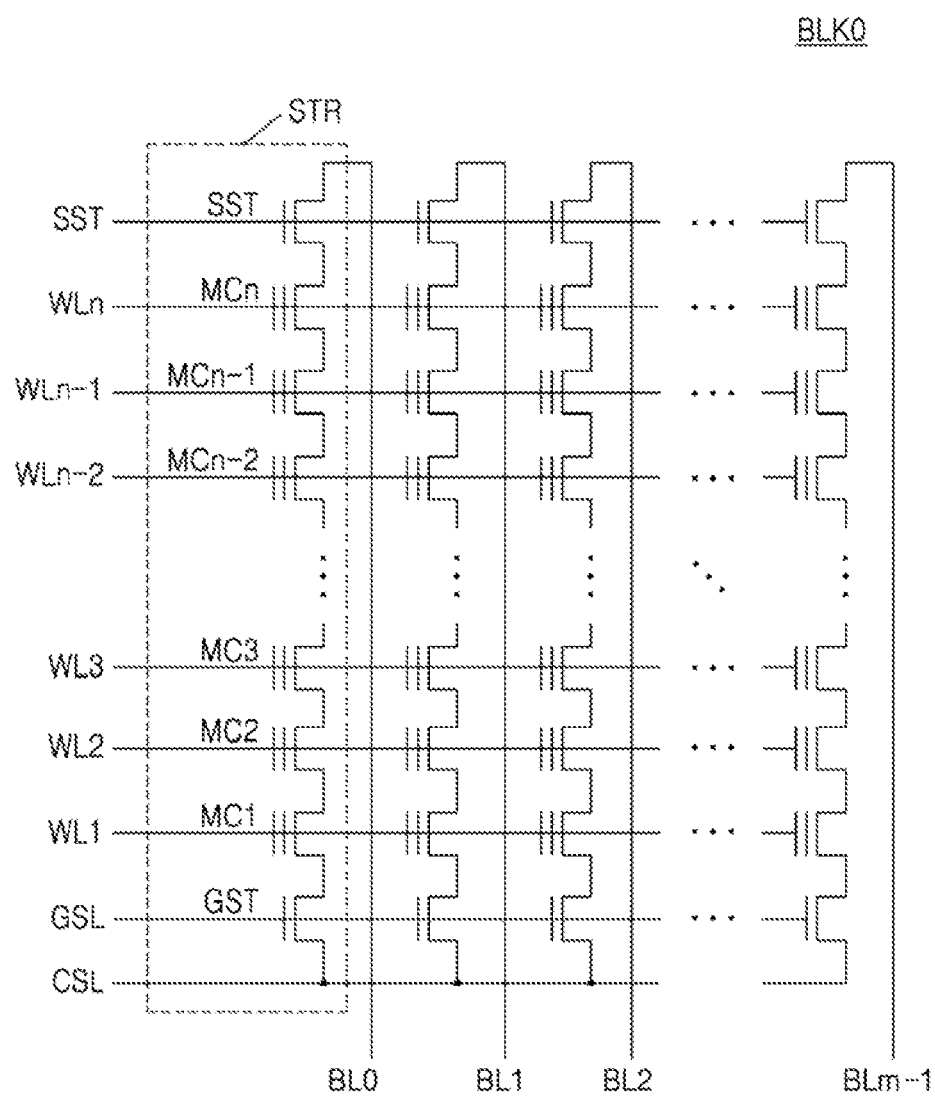
FIG. 14 illustrates an embodiment of a memory block.

FIG. 14 illustrates an embodiment of a memory block. Referring to FIG. 14, a memory cell array (e.g., the memory cell array 20 in FIG. 1) may be a memory cell array of a horizontal NAND flash memory and may include a plurality of memory blocks. Each memory block BLK0 may include m (m is an integer equal to or greater than 2) cell strings STR in which a plurality of memory cells MC are connected in series across bit lines BL0 through BLm-1.

In a NAND flash memory device having the structure as shown in FIG. 14, an erase operation is performed block-by-block and a program operation is performed page-by-page, where pages may correspond to word lines WL0 through WLn-1. FIG. 14 illustrates an example in which n pages respectively corresponding to n word lines WL1 through WLn-1 are arranged per block. Furthermore, in one embodiment, the non-volatile memory device 1 of FIG. 1 may include a plurality of memory cell arrays having the same structure and performing the same operation as the memory cell array 20 described above.

Figure 15:
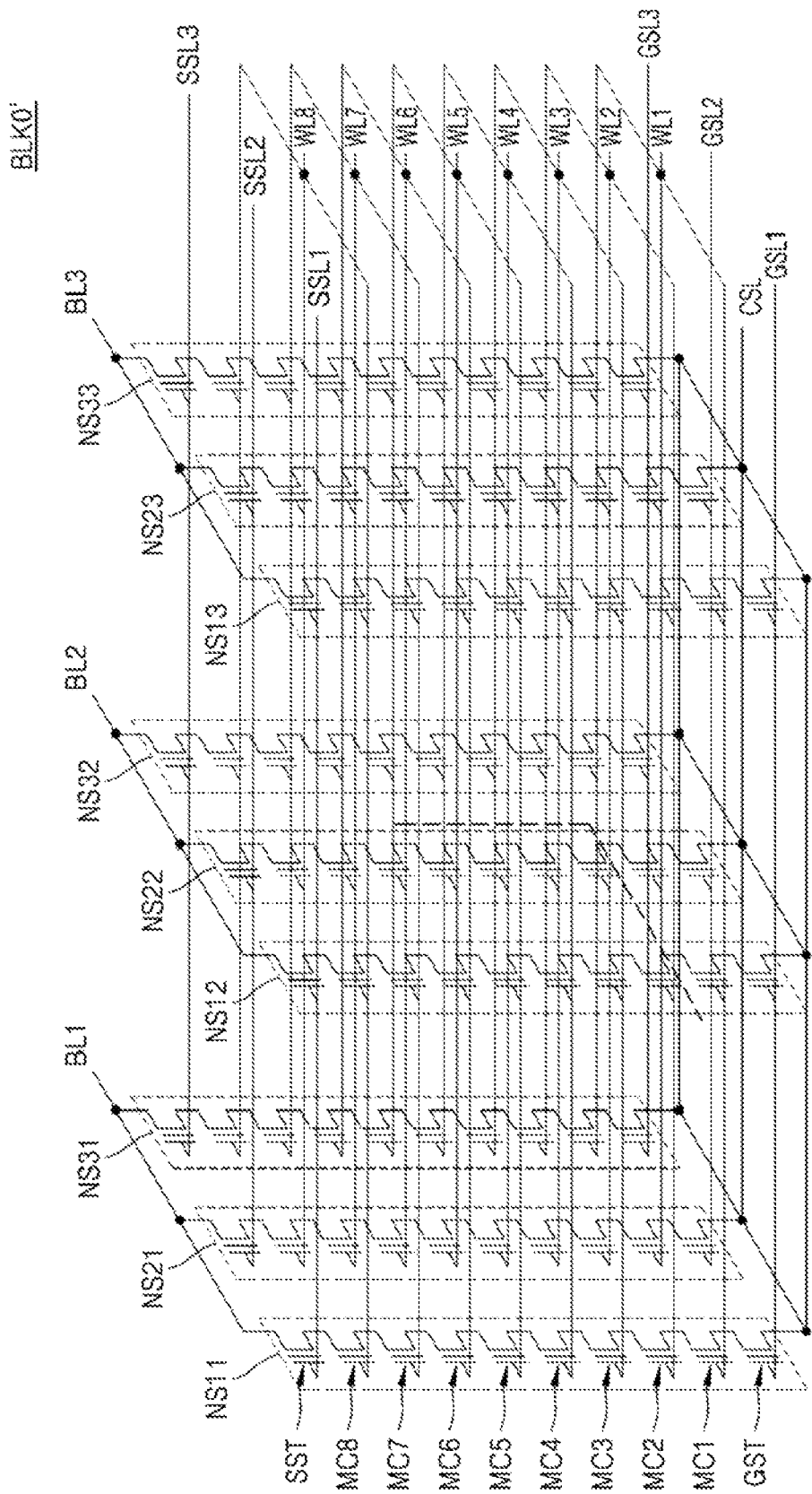
FIG. 15 illustrates another embodiment of a memory block.

FIG. 15 illustrates another embodiment of a memory block in a memory cell array. Referring to FIG. 15, a memory cell array (the memory cell array 20 in FIG. 1) may be a memory cell array of a vertical NAND flash memory and may include a plurality of memory blocks. Each memory block BLK0' may include a plurality of NAND cell strings NS11 through NS33, a plurality of word lines WL1 through WL8, a plurality of bit lines BL1 through BL3, a plurality of ground select lines GSL1 through GSL3, a plurality of cell string select lines SSL1 through SSL3, and a common source line CSL. FIG. 15 illustrates an example in which eight word lines WL1 through WL8 are arranged in one block. In one embodiment, eight or more word lines may be arranged. The number of NAND cell strings, the number of word lines, the number of bit lines, the number of ground select lines, and the number of cell string select lines may be different among various embodiments.

NAND cell strings NS11, NS21, and NS31 are between a first bit line BL1 and the common source line CSL. NAND cell strings NS12, NS22, and NS32 are between a second bit line BL2 and the common source line CSL. NAND cell strings NS13, NS23, and NS33 are between a third bit line BL3 and the common source line CSL. Each NAND cell string (e.g., the NAND cell string NS11) may include a cell string select transistor SST, a plurality of memory cells MC1 through MC8, and a ground select transistor GST that are connected in series.

NAND cell strings connected in common to one bit line constitute one column. For example, the NAND cell strings NS12, NS21, and NS31 connected in common to the first bit line BL1 may correspond to a first column. The NAND cell strings NS12, NS22, and NS32 connected in common to the second bit line BL2 may correspond to a second column. The NAND cell strings NS13, NS23, and NS33 connected in common to the third bit line BL3 may correspond to a third column.

NAND cell strings connected to one cell string select line constitute one row. For example, NAND cell strings NS21, NS12, and NS13 connected to a first cell string select line SSL1 correspond to a first row. NAND cell strings NS21, NS22, and NS23 connected to a second cell string select line SSL2 correspond to a second row. NAND cell strings NS31, NS32, and NS33 connected to a third cell string select line SSL3 correspond to a third row.

Cell string select transistors SST are connected to the corresponding cell string select lines SSL1 through SSL3, respectively. The plurality of memory cells MC1 through MC8 are connected to the corresponding word lines WL1 through WL8, respectively. The ground select transistors GST are connected to the corresponding ground select line GSL1 through GSL3, respectively. The cell string select transistors SST are respectively connected to the corresponding bit lines BL1 through BL3. The ground select transistors GST are connected to the common source line CSL.

The word lines (e.g., first word lines WL1) at a same level are connected to one another in common. The cell string select lines SSL1 through SSL3 are separated from one another, and the ground select lines GSL1 through GSL3 are also separated from one another. For example, the first word lines WL1 and the first cell string select line SSL1 are selected when memory cells are connected to the first word lines WL1 and belong to the NAND cell string NS11, NS12, and NS13. The ground select lines GSL1 through GSL3 may also be connected to one another in common.

Figure 16:
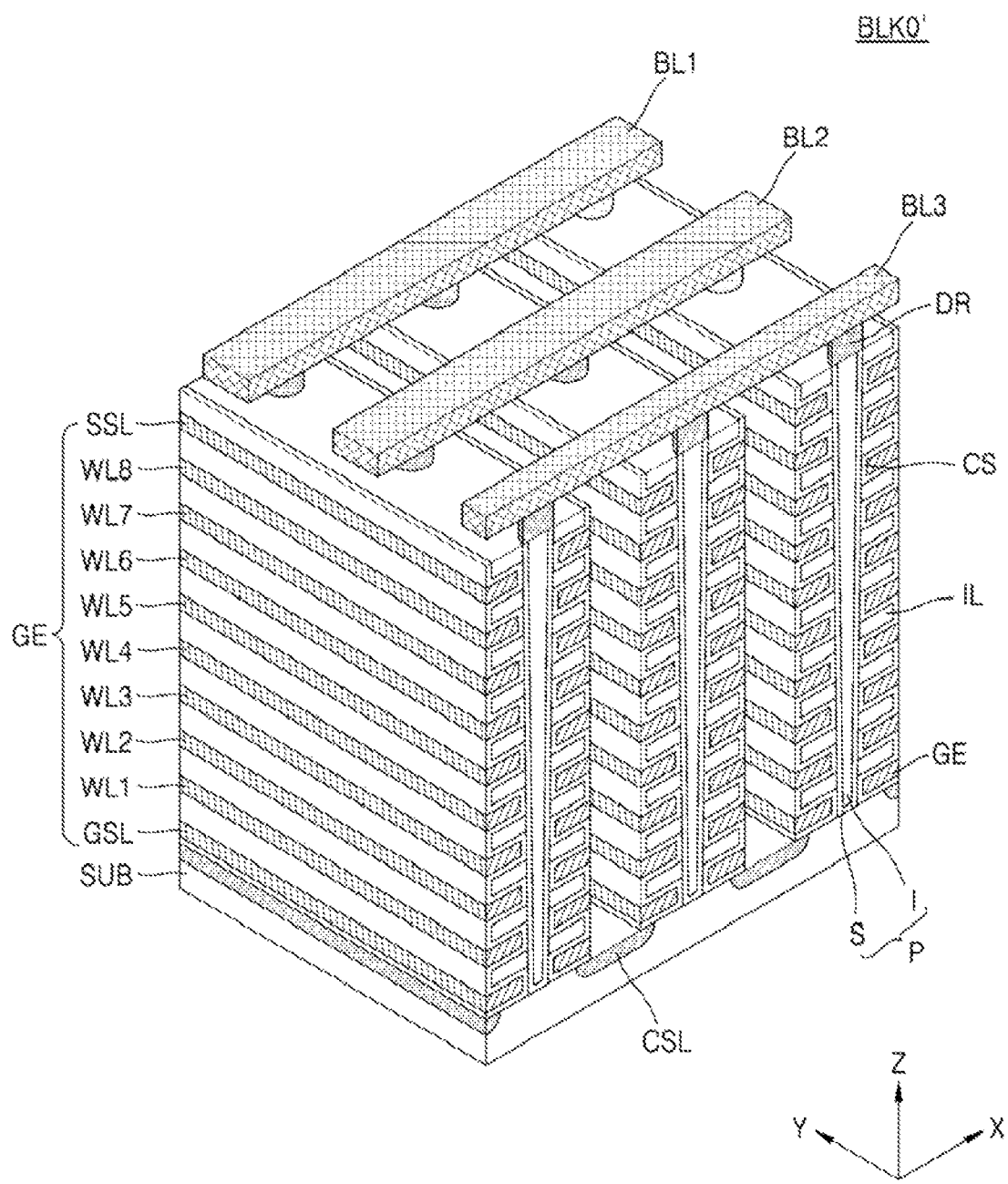
FIG. 16 illustrates another embodiment of a memory block.

FIG. 16 illustrates an embodiment of the memory block BLK0' of FIG. 15. Referring to FIG. 16, each memory block in a memory cell array (e.g., the memory cell array 20 in FIG. 1) is formed along a direction perpendicular to a substrate SUB. FIG. 16 shows that each memory block includes two select lines GSL and SSL, eight word lines WL1 through WL8, and three bit lines BL1 through BL3. The numbers of these elements may be greater or smaller in other embodiments.

The substrate SUB has a first conductivity type (e.g., p type), where the common source line CSL extending along a first direction (e.g., the Y direction) and doped with impurities having a second conductivity type (e.g., n type) is provided on the substrate SUB. A plurality of insulation films IL extending along the first direction are sequentially provided along a third direction (e.g., the Z direction) in a region of the substrate SUB between two common source lines CSL adjacent to each other. The plurality of insulation films IL are a particular distance apart from one another along the third direction. For example, the plurality of insulation films IL may include an insulation material, such as a silicon oxide.

A plurality of pillars P are sequentially arranged along the first direction in a region of the substrate SUB between two adjacent common source lines CSL and penetrate through the plurality of insulation films IL along the first direction. For example, the plurality of pillars P penetrate through the plurality of insulation films IL and contact the substrate SUB. For example, a surface layer S of each pillar P may include, for example, a silicon-based material having a first conductivity type and may function as a channel region. An inner layer I of each pillar P may include, for example, an insulating material such as but not limited to silicon oxide or an air gap.

A charge storage layer CS is provided in a region between two adjacent common source lines CSL and along exposed surfaces of the insulation films IL, the plurality of pillars P, and the substrate SUB. The charge storage layer CS may include a gate insulation layer (e.g., also referred to as a 'tunneling insulation layer'), a charge trapping layer, and a blocking insulation layer. The charge storage layer CS may have, for example, an oxide-nitride-oxide (ONO) structure. Gate electrodes GE including the select lines GSL and SSL and the word lines WL1 through WL8 may be in the region between two adjacent common source lines CSL and on an exposed surface of the charge storage layer CS.

Drains or drain contacts DR are on the plurality of pillars P, respectively. For example, the drains or drain contacts DR may include a silicon-based material doped with impurities having a second conductivity type. Bit lines BL1 through BL3, which extend along a second direction (e.g., X direction) and are arranged a certain distance apart from one another along the first direction, are provided on the drains DR.

Figure 17:
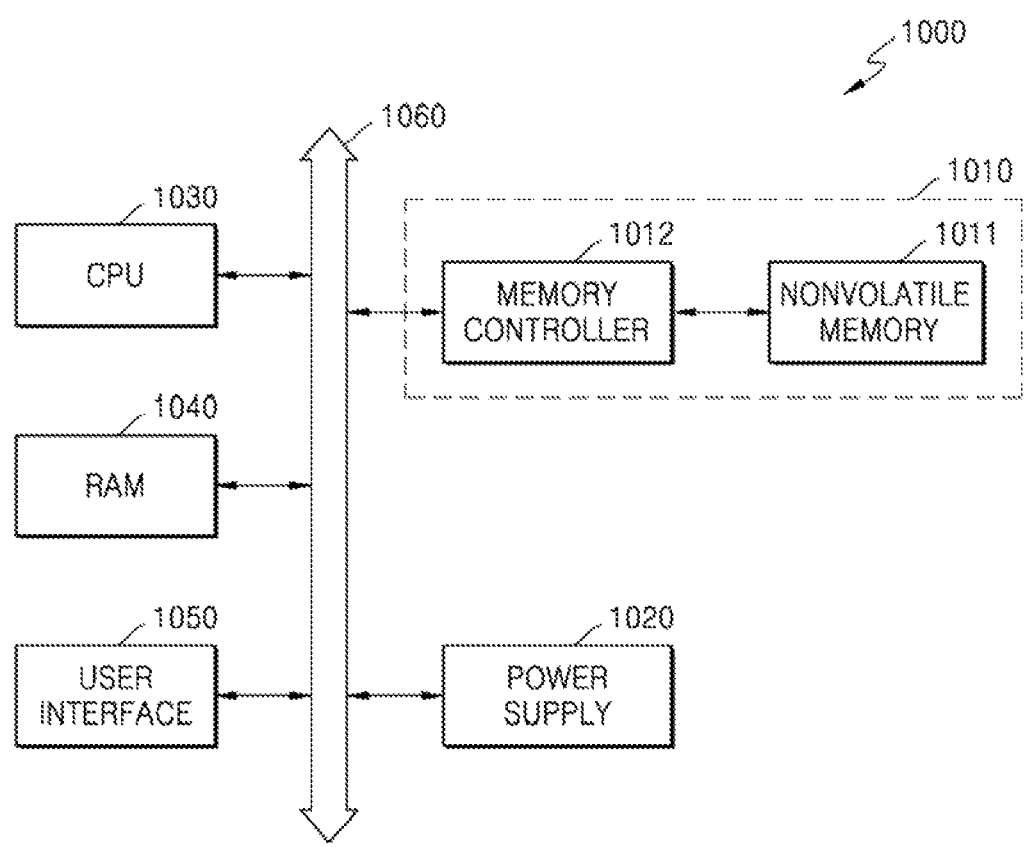
FIG. 17 illustrates an embodiment of a computing system device.

FIG. 17 illustrates an embodiment of a computing system device 1000 having a non-volatile memory device according any of the embodiments described herein.

Referring to FIG. 17, the computing system device 1000 may include a CPU 1030, a user interface 1050, a memory controller 1012, and a memory device 1010 having the memory controller 1012 and a non-volatile memory device 1011, where the above-stated components are electrically connected to a bus 1060.

The memory device 1010 may include at least one of the data output circuits 100 and 100b of FIGS. 2 and 8 and at least one of the output drivers 110 and 110b of FIGS. 3 and 6. Therefore, the memory device 1010 may have a constant ON-resistance, and a power supply voltage having a wide range of voltage levels may be selectively applied to the output driver. As a result, power consumption may be reduced. The computing system device 1000 may further include a RAM 1040 and a power supply device 1020.

When the computing system device 1000 is a mobile device, a battery for supplying a voltage for operating the computing system device 1000 and a modem like a baseband chipset may be further provided. Furthermore, the computing system device 1000 may be provided with an application chipset, a camera image processor, a mobile DRAM, etc., detailed description thereof will be omitted.

The memory controller 1012 and the non-volatile memory device 1011 may constitute a solid state drive/disk SSD using a non-volatile memory for storing data, for example.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The voltage generators, controllers, decoders, drivers, and other signal providing, signal generating, and signal processing features of the embodiments described herein may be implemented in non-transitory logic which, for example, may include hardware, software, or both. When implemented at least partially in hardware, the voltage generators, controllers, decoders, drivers, and other signal providing, signal generating, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the voltage generators, controllers, decoders, drivers, and other signal providing, signal generating, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Figure 18A:
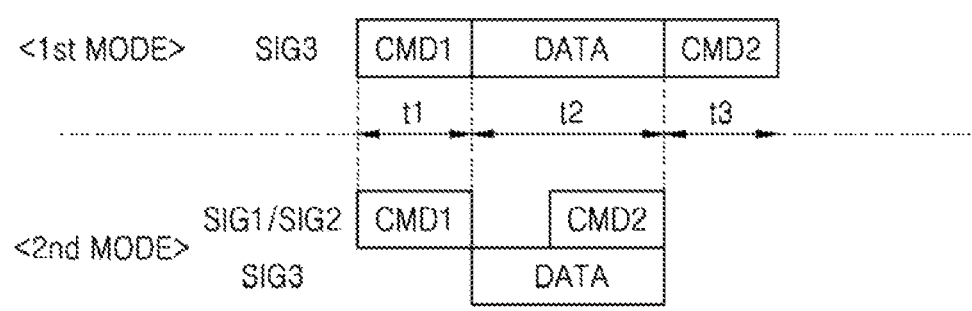
FIG. 18A illustrates an embodiment of signals received to a memory device.
Figure 18B:
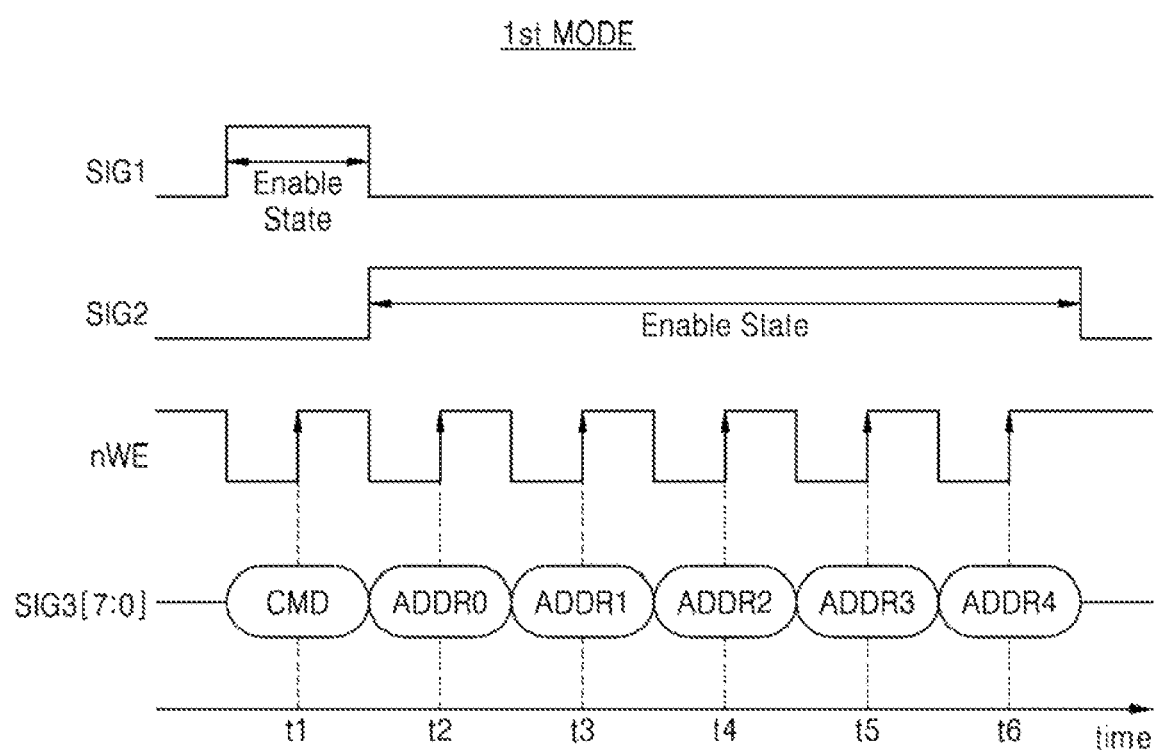
FIG. 18B is timing diagram illustrating an example of a memory device receiving a command and an address in a first mode.
Figure 18C:
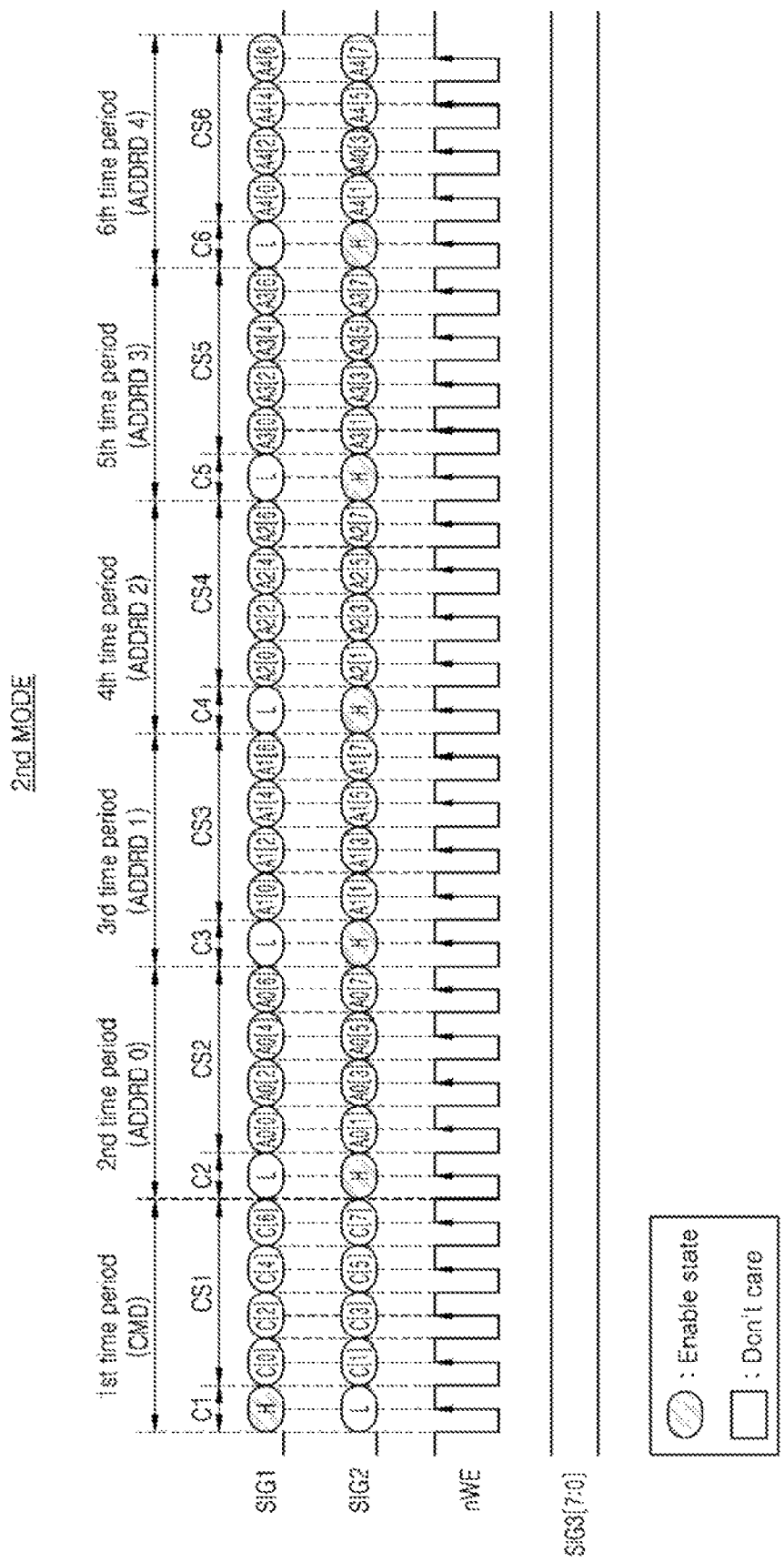
FIG. 18C is timing diagram illustrating an example of a memory device receiving a command and an address in a second mode.

FIG. 18A illustrates an embodiment of signals received to a memory device. FIG. 18B is timing diagram illustrating an example of a memory device receiving a command and an address in a first mode. FIG. 18C is timing diagram illustrating an example of a memory device receiving a command and an address in a second mode. Specifically, FIGS. 18A and 18B illustrate an example in which the non-volatile memory device 1011 receives a command CMD and addresses ADDR0 to ADDR4. Hereinafter, as shown in FIGS. 18A and 18B, the third signals SIG3 [7:0] are received through eight pins, the embodiments of the present invention will be described on the basis of, but the present invention is not limited thereto.

Referring to FIGS. 17 and 18A, the non-volatile memory device 1011 may obtain a first command CMD1 from the third signals SIG3 during a first time t1 in a first mode. The non-volatile memory device 1011 may obtain data DATA from the third signals SIG3 during a second time t2 or transmit the third signals SIG3 including data DATA to the memory controller 1012 during the second time t2. The non-volatile memory device 1011 may obtain the second command CMD2 from the third signals SIG3 during a third time t3. That is, in the first mode, the first command CMD1, the data DATA, and the second command CMD2 are transmitted through the third signals SIG3 during the first to third times t1 to t3.

On the other hand, in a second mode, the non-volatile memory device 1011 may obtain the first command CMD1 from the first and second signals SIG1 and SIG2 during a first time t1. The non-volatile memory device 1011 may obtain data DATA from the third signals SIG3 during a second time t2, or transmit third signals SIG3 including data DATA during the second time t2. The non-volatile memory device 1011 may obtain a second command CMD2 from the first and second signals SIG1 and SIG2 while the data DATA is transmitted through the third signals SIG3, in the second mode. That is, in the second mode, the first command CMD1, the data DATA, and the second command CMD2 through the first to third signals SIG1 to SIG3 during the first and second times t1 and t2. Accordingly, the time when the first command CMD1, the data DATA, and the second command CMD2 are transmitted in the second mode may be less than the time transmitted in the first mode. However, the present invention is not limited thereto, and the non-volatile memory device 1011 may operate in one mode of the first mode and the second mode.

Referring to FIGS. 17 and 18A, the non-volatile memory device 1011 may receive third signals SIG3[7:0] including a command CMD and addresses ADDR0~ADDR4 in the first mode. The non-volatile memory device 1011 may receive an enable signal (e.g., write enable signal nWE) toggling, while the third signals SIG3[7:0] including the command CMD and the addresses ADDR0~ADDR4 are received.

The non-volatile memory device 1011 may obtain the command CMD from the third signals SIG3[7:0] in the enable period of a first signal SIG1, and obtain the addresses ADDR0~ADDR4 from the third signals SIG3[7:0] in the enable period of a second signal SIG2. For example, the non-volatile memory device 1011 may latch the third signals SIG3[7:0] at rising edges of the enable signal nWE to obtain the command CMD (at a first time point t1) and the addresses ADDR0~ADDR4 (at second to sixth time points t2 to t6).

Referring to FIGS. 17 and 18A, the non-volatile memory device 1011 may receive a first signal SIG1 and a second signal SIG2 including a command CMD and addresses ADDR0~ADDR4 in the second mode. The non-volatile memory device 1011 may receive an enable signal (e.g., write enable signal nWE) toggling, while the first signal SIG1 and the second signal SIG2 including the command CMD and the addresses ADDR0~ADDR4 are received. For example, a toggling frequency of the enable signal nWE received by the non-volatile memory device 1011 in the second mode may be greater than a toggling frequency of the enable signal nWE received by the non-volatile memory device 1011 in the first mode.

In an exemplary embodiment of the memory device, at least one of the first pull-up driver PU and the second pull-up driver NU included in the output driver 110b may be driven according to the frequency of the enable signal nWE. For example, when the frequency of the enable signal nWE is relatively high, the second pull-up driver NU among the first pull-up driver PU and the second pull-up driver NU may be driven. On the other hand, for example, the frequency of the enable signal nWE is relatively low, the first pull-up driver PU and the second pull-up driver NU may be driven.

When the first signal SIG1 received during a first cycle period C1 in a first time period is in the enabled state (e.g., high (H) level), the non-volatile memory device 1011 may obtain the command CMD from the first signal SIG1 and the second signal SIG2 received during a cycle periods CS1. In this case, the second signal SIG2 received during the first cycle period Cl may be in a disabled state (e.g., a low (L) level). During the cycle periods CS1, the non-volatile memory device 1011 may obtain the command CMD from eight signal values C[0]~C[7] of the first signal SIG1 and the second signal SIG2 sampled at the rising edge of the enable signal nWE. The signal values C[0]~C[7] of the first signal SIG1 and the second signal SIG2 may correspond to the third signals SIG3[7:0] sampled at the first time point t1 of FIG. 18A.

When the second signal SIG2 received during a second cycle period C2 in a second time period is in the enabled state (e.g., high (H) level), the non-volatile memory device 1011 may obtain the address ADDR0 from the first signal SIG1 and the second signal SIG2 received during a cycle periods CS1. In this case, the first signal SIG1 received during the second cycle period C2 may be in a disabled state (e.g., a low (L) level). During the cycle periods CS2, the non-volatile memory device 1011 may obtain the address ADDR0 from eight signal values A[0]~A[7] of the first signal SIG1 and the second signal SIG2 sampled at the rising edge of the enable signal nWE. The signal values A[0]~A[7] of the first signal SIG1 and the second signal SIG2 may correspond to the third signals SIG3[7:0] sampled at the second time point t2 of FIG. 18A. Likewise, the non-volatile memory device 1011 may obtain the addresses ADDR2 to ADDR4 from the first signal SIG1 and the second signal SIG2 received in the third to sixth time periods.

While the first signal SIG1 and the second signal SIG2 are received, each of the third signals SIG3[7:0] may be "don't care" state. For example, each of the third signals SIG3[7:0] may have at least one of a low level, a high level, and a high resistance state.

When each of the third signals SIG3[7:0] has a low level or a high level, a value of each of the third signals SIG3[7:0] may be a valid value or an invalid value. For example, while the command CMD or the addresses ADDR0 to ADDR4 are received from the first signal SIG1 and the second signal SIG2, and data DATA is received from the third signals SIG3[7:0], each of the third signals SIG3[7:0] may include a valid data value.

However, the non-volatile memory device 1011 according to the present disclosure is not limited thereto, and the non-volatile memory device 1011 may classify the command CMD and the address ADDR from the first signal SIG1 and the second signal SIG2 received in a predetermined time period using various methods.

Figure 19:
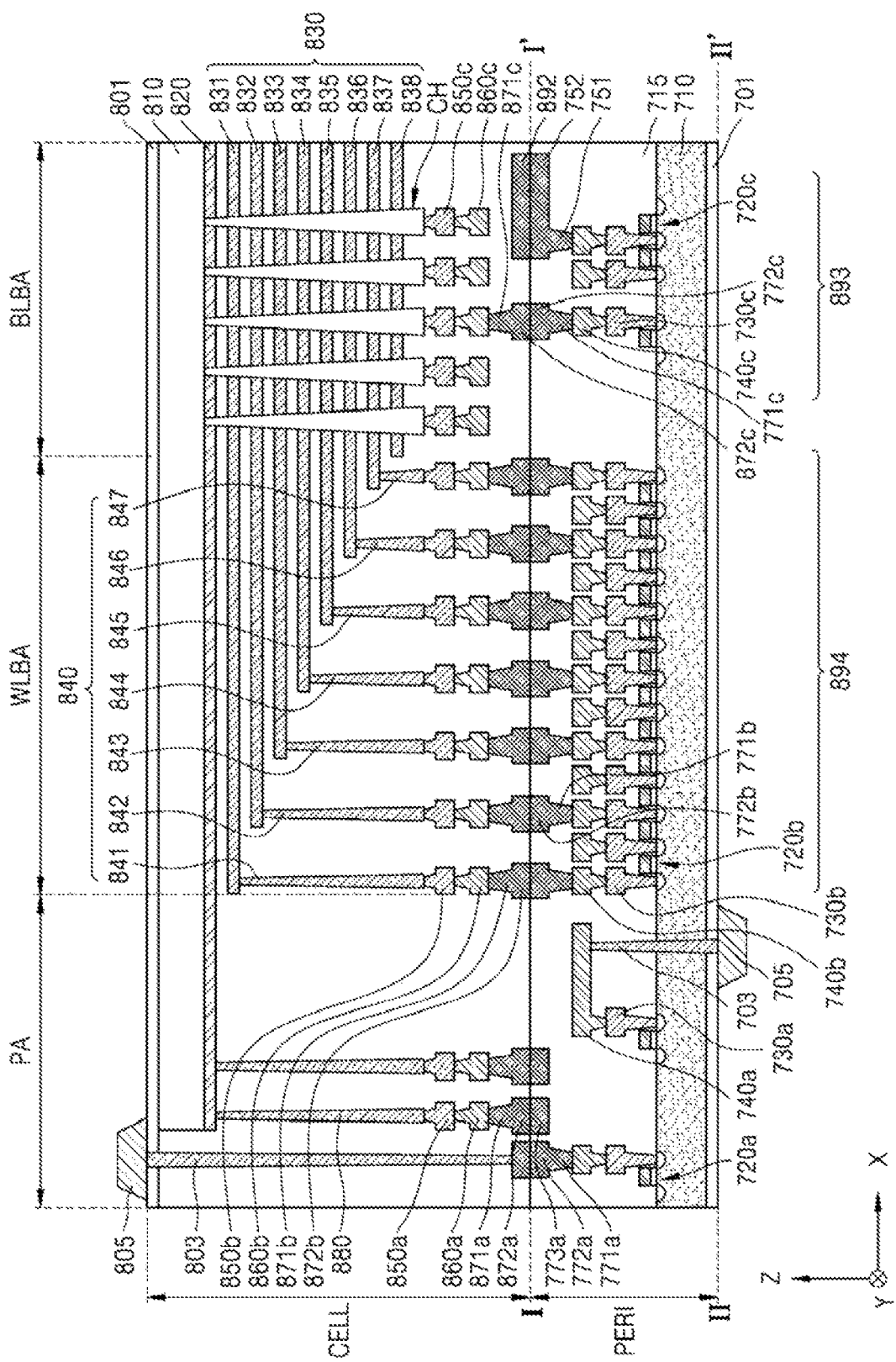
FIG. 19 illustrates a memory device having a chip-to-chip structure, according to exemplary embodiment of the inventive concept.

FIG. 19 illustrates a memory device 900 having a chip-to-chip structure, according to exemplary embodiments of the inventive concept.

Referring to FIG. 19, the memory device 900 may have a chip-to-chip (C2C) structure. The C2C structure may refer to a structure formed by manufacturing an upper chip including a memory cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the memory cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740a, 740b, and 740c may be formed of copper having relatively low resistance.

In an example embodiment illustrate in FIG. 19, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b and the upper bonding metals 871b and 872b may be formed of aluminum, copper, tungsten, or the like. Further, the upper bonding metals 871b and 872b in the memory cell region CELL may be referred as first metal pads, and the lower bonding metals 771b and 772b in the peripheral circuit region PERI may be referred as second metal pads. The lower bonding metals 771b and 772b in the peripheral circuit region PERI may be electrically connected to the upper bonding metals 871b and 872b in the memory cell region CELL in a bonding manner.

The memory cell region CELL may include at least one memory block. The memory cell region CELL may include a second substrate 810 and a common source line 820. On the second substrate 810, a plurality of word lines 831 to 838 (i.e., 830) may be stacked in a vertical direction (a Z axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a second horizontal direction (a Y axis direction), parallel to the upper surface of the second substrate 810.

In an example embodiment illustrated in FIG. 19, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the memory cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a first horizontal direction (an X axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the first horizontal direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the memory cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 19, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 19, an upper insulating film 801 covering the upper surface of the second substrate 810 may be formed on the second substrate 810, and a second input-output pad 805 may be disposed on the upper insulating film 801. The second input-output pad 805 may be connected to at least one of the plurality of circuit elements 720a, 720b, and 720c disposed in the peripheral circuit region PERI through a second input-output contact plug 803.

According to embodiments, the second substrate 810 and the common source line 820 may not be disposed in an area in which the second input-output contact plug 803 is disposed. Also, the second input-output pad 805 may not overlap the word lines 830 in the vertical direction. Referring to FIG. 19, the second input-output contact plug 803 may be separated from the second substrate 810 in a direction, parallel to the upper surface of the second substrate 810, and may pass through the interlayer insulating layer 815 of the memory cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

In an example embodiment, signals including a clock signal may be received from the outside (e.g., a memory controller) through at least one of the first input-output pad 705 and the second input-output pad 805. In an example embodiment, a voltage may be applied from the outside through at least one of the first input-output pad 705 and the second input-output pad 805.

In an example embodiment, control logic 60 may provide an output control signal CTRL_O to the data input/output circuit 10 according to a level of a power supply voltage used in the memory device 900 and information regarding an operating frequency of the memory device 900 (e.g., a frequency of the clock signal), the data input/output circuit 10 may output a data signal DQ according to data read from the memory cell region CELL.

In an example embodiment, the memory device 900 may receive a first signal, a second signal, a third signal, and an enable signal (e.g., a write enable signal or/and a read enable signal) from the outside (e.g., a memory controller) through at least one of the first input-output pad 705 and the second input-output pad 805.

In a first mode, the memory device 900 may receive the third signal including a command, an address, and the data signal DQ, and the enable signal toggling during a time period for receiving the third signal. For example, the memory device 900 may receive the command from the third signal in an enable period of the first signal, and receive the address from the third signal in an enable period of the second signal.

In a second mode, the memory device 900 may receive the first signal and second signal including the command and the address. While the first signal and the second signal including the command and the address are received, the memory device 900 may receive the enable signal toggling, from the memory controller. The memory device 900 may receive the third signal including the data signal DQ.

A metal pattern in an uppermost metal layer may be provided as a dummy pattern or the uppermost metal layer may be absent, in each of the external pad bonding area PA and the bit line bonding area BLBA, respectively included in the memory cell region CELL and the peripheral circuit region PERI.

In the external pad bonding area PA, the memory device 900 may include a lower metal pattern 773a, corresponding to an upper metal pattern 872a formed in an uppermost metal layer of the memory cell region CELL, and having the same shape as the upper metal pattern 872a of the memory cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the memory cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the memory cell region CELL by a Cu-Cu bonding.

Further, the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the memory cell region CELL. A contact may not be formed on the upper metal pattern 892 formed in the uppermost metal layer of the memory cell region CELL.

In an example embodiment, corresponding to a metal pattern formed in an uppermost metal layer in one of the memory cell region CELL and the peripheral circuit region PERI, a reinforcement metal pattern having the same shape as the metal pattern may be formed in an uppermost metal layer in another one of the memory cell region CELL and the peripheral circuit region PERI, and a contact may not be formed on the reinforcement metal pattern.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A non-volatile memory device, comprising:
a voltage generator;
an output driver configured to output a data signal; and
an operating signal generator configured to generate a plurality of operating signals for operating the output driver,
wherein the output driver includes:
a pull-up driver including a first pull-up driver having at least one P-type transistor and a second pull-up driver having at least one N-type transistor; and
a pull-down driver having at least one N-type transistor,
wherein outputs of the first pull-up driver and the second pull-up driver are coupled together for generating a current at a common output node,
wherein a power supply voltage applied to one end of the at least one P-type transistor of the first pull-up driver and one end of the at least one N-type transistor of the second pull-up driver have the same voltage level, and
wherein the operating signal generator configured to generate the plurality of operating signals according to the voltage level of the power supply voltage so that the at least one P-type transistor of the first pull-up driver and the at least one N-type transistor of the second pull-up driver are selectively operated.

2. The non-volatile memory device as claimed in claim 1, wherein only the at least one P-type transistor of the first pull-up driver is configured to be turned-on when a first power supply voltage is applied to the first pull-up driver and the second pull-up driver, and the at least one P-type transistor of the first pull-up driver and the at least one N-type transistor of the second pull-up driver are configured to be turned-on when a second power supply voltage is applied to the first pull-up driver and the second pull-up driver.

3. The non-volatile memory device as claimed in claim 2, wherein the first power supply voltage is higher than the second power supply voltage.

4. The non-volatile memory device as claimed in claim 1, further comprising:
a first chip including a memory cell region, the memory cell region including a first metal pad exposed at a lower surface of the first chip, and a memory cell array including a plurality of memory cells; and
a second chip combined with the first chip in a stack and including a peripheral circuit region, the peripheral circuit region including a second metal pad exposed at an upper surface of the second chip, and vertically connected to the memory cell region by bonding the first metal pad and the second metal pad together,
wherein the voltage generator, the output driver, and the operating signal generator are included in the peripheral circuit region of the second chip.

5. A non-volatile memory device, comprising:
a voltage generator;
an output driver configured to output a data signal; and
an operating signal generator configured to generate a plurality of operating signals for operating the output driver,
wherein the output driver includes:
a pull-up driver including a first pull-up driver having at least one P-type transistor and a second pull-up driver having at least one N-type transistor; and
a pull-down driver having at least one N-type transistor,
wherein outputs of the first pull-up driver and the second pull-up driver are coupled together for generating a current at a common output node,
wherein a power supply voltage applied to one end of the at least one P-type transistor of the first pull-up driver and one end of the at least one N-type transistor of the second pull-up driver have the same voltage level, and
wherein the operating signal generator configured to generate the plurality of operating signals based on a frequency of a clock signal so that the first pull-up driver and the second pull-up driver are selectively operated.

6. The non-volatile memory device as claimed in claim 5, wherein only the at least one N-type transistor of the second pull-up driver is configured to be turned-on when the clock signal has a first frequency, and the at least one P-type transistor of the first pull-up driver and the at least one N-type transistor of the second pull-up driver are configured to be turned-on when the clock signal has a second frequency.

7. The non-volatile memory device as claimed in claim 6, wherein the first frequency is greater than the second frequency.

8. The non-volatile memory device as claimed in claim 7, wherein a termination of the data signal is applied when the clock signal has the first frequency.

9. The non-volatile memory device as claimed in claim 7, wherein a termination of the data signal is not applied when the clock signal has the second frequency.

10. The non-volatile memory device as claimed in claim 5, wherein only the at least one P-type transistor of the first pull-up driver is configured to be turned-on when the clock signal has a first frequency, and only the at least one N-type transistor of the second pull-up driver is configured to be turned-on when the clock signal has a second frequency.

11. The non-volatile memory device as claimed in claim 10, wherein the first frequency is less than the second frequency.

12. The non-volatile memory device as claimed in claim 11, wherein a termination of the data signal is applied when the clock signal has the second frequency.

13. The non-volatile memory device as claimed in claim 11, wherein a termination of the data signal is not applied when the clock signal has the first frequency.

14. The non-volatile memory device as claimed in claim 5, further comprising:
- a first chip including a memory cell region, the memory cell region including a first metal pad exposed at a lower surface of the first chip, and a memory cell array including a plurality of memory cells; and
- a second chip combined with the first chip in a stack and including a peripheral circuit region, the peripheral circuit region including a second metal pad exposed at an upper surface of the second chip, and vertically connected to the memory cell region by bonding the first metal pad and the second metal pad together,
- wherein the voltage generator, the output driver, and the operating signal generator are included in the peripheral circuit region of the second chip.

15. A non-volatile memory device, comprising:
a voltage generator;
an output driver configured to output a data signal; and
an operating signal generator configured to generate a plurality of operating signals for operating the output driver,
wherein the output driver includes:
a pull-up driver including a first pull-up driver having at least one P-type transistor and a second pull-up driver having at least one N-type transistor; and
a pull-down driver having at least one N-type transistor,
wherein outputs of the first pull-up driver and the second pull-up driver are coupled together for generating a current at a common output node,
wherein a power supply voltage applied to one end of the at least one P-type transistor of the first pull-up driver and one end of the at least one N-type transistor of the second pull-up driver have the same voltage level,
wherein an operation mode of the output driver changes according to a command received from a controller external to the non-volatile memory device, and
wherein the operating signal generator configured to generate the plurality of operating signals based on the operation mode so that the first pull-up driver and the second pull-up driver are selectively operated.

16. The non-volatile memory device as claimed in claim 15, wherein the voltage level of the power supply voltage applied to the output driver varies according to the operation mode.

17. The non-volatile memory device as claimed in claim 16, wherein only the at least one P-type transistor of the first pull-up driver is configured to be turned-on when a first power supply voltage is applied to the first pull-up driver and the second pull-up driver, and the at least one P-type transistor of the first pull-up driver and the at least one N-type transistor of the second pull-up driver are configured to be turned-on when a second power supply voltage is applied to the first pull-up driver and the second pull-up driver.

18. The non-volatile memory device as claimed in claim 17, wherein the first power supply voltage is higher than the second power supply voltage.

19. The non-volatile memory device as claimed in claim 16, further comprising:
- a first chip including a memory cell region, the memory cell region including a first metal pad exposed at a lower surface of the first chip, and a memory cell array including a plurality of memory cells; and
- a second chip combined with the first chip in a stack and including a peripheral circuit region, the peripheral circuit region including a second metal pad exposed at an upper surface of the second chip, and vertically connected to the memory cell region by bonding the first metal pad and the second metal pad together,
- wherein the voltage generator, the output driver, and the operating signal generator are included in the peripheral circuit region of the second chip.

20. The non-volatile memory device as claimed in claim 15, wherein a frequency of a clock signal varies according to the operation mode.

21. The non-volatile memory device as claimed in claim 20, wherein only the at least one N-type transistor of the second pull-up driver is configured to be turned-on when the clock signal has a first frequency, and the at least one P-type transistor of the first pull-up driver and the at least one N-type transistor of the second pull-up driver are configured to be turned-on when the clock signal has a second frequency less than the first frequency.

22. The non-volatile memory device as claimed in claim 21, wherein a termination of the data signal is applied when the clock signal has the first frequency.

23. The non-volatile memory device as claimed in claim 21, wherein a termination of the data signal is not applied when the clock signal has the second frequency.

24. The non-volatile memory device as claimed in claim 20, further comprising:
- a first chip including a memory cell region, the memory cell region including a first metal pad exposed at a lower surface of the first chip, and a memory cell array including a plurality of memory cells; and
- a second chip combined with the first chip in a stack and including a peripheral circuit region, the peripheral circuit region including a second metal pad exposed at an upper surface of the second chip, and vertically connected to the memory cell region by bonding the first metal pad and the second metal pad together,
- wherein the voltage generator, the output driver, and the operating signal generator are included in the peripheral circuit region of the second chip.

* * * * *